(12) United States Patent
Moore et al.

(10) Patent No.: US 10,809,324 B2
(45) Date of Patent: Oct. 20, 2020

(54) SUPPORT FOR AN ELECTRONIC TABLET FOR USE IN FUNCTIONAL MRI

(71) Applicant: Indiana University Research and Technology Corporation, Indianapolis, IN (US)

(72) Inventors: Richard Moore, Libertyville, IL (US); Jesse Goode, Bloomington, IN (US)

(73) Assignee: Indiana University Research and Technology Corporation, Indianapolis, IN (US)

( * ) Notice: Subject to any disclaimer, the term of this patent is extended or adjusted under 35 U.S.C. 154(b) by 0 days.

(21) Appl. No.: 16/322,911

(22) PCT Filed: Aug. 3, 2017

(86) PCT No.: PCT/US2017/045242
§ 371 (c)(1),
(2) Date: Feb. 1, 2019

(87) PCT Pub. No.: WO2018/027000
PCT Pub. Date: Feb. 8, 2018

(65) Prior Publication Data
US 2019/0170836 A1 Jun. 6, 2019

Related U.S. Application Data

(60) Provisional application No. 62/370,436, filed on Aug. 3, 2016.

(51) Int. Cl.
*F16M 11/00* (2006.01)
*G01R 33/28* (2006.01)
(Continued)

(52) U.S. Cl.
CPC ......... *G01R 33/283* (2013.01); *F16M 11/043* (2013.01); *F16M 11/425* (2013.01);
(Continued)

(58) Field of Classification Search
CPC ........................... G01R 33/283; A61B 5/1124
See application file for complete search history.

(56) References Cited

U.S. PATENT DOCUMENTS 5,085,219 A  2/1992 Orthendahl et al.
7,569,021 B2 * 8/2009 Sebelius .............. A61H 31/008
601/41

(Continued)

OTHER PUBLICATIONS

International Search Report and Written Opinion issued by the ISA/US Commissioner for Patents, dated Oct. 6, 2017, for International Application No. PCT/US2017/045242; 5 pages.

*Primary Examiner* — Steven M Marsh
(74) *Attorney, Agent, or Firm* — Faegre Drinker Biddle & Reath LLP

(57) ABSTRACT

A support (26) for a tablet (22) for use in a Functional Magnetic Resonance Imaging (fMRI) machine (12) is provided. The support (26) includes a plurality of curved braces (80, 82) configured to mount within a bore (16) of the fMRI machine (12); a channel (90) coupled to one end of the curved braces (80, 82); and a pair of lower braces (86) coupled to another end of the curved braces (80, 82); wherein the channel (90) includes a C-shaped opening (108) configured to receive a mounting bracket (24) coupled to the tablet (22).

20 Claims, 22 Drawing Sheets

(51) Int. Cl.
*G01R 33/48* (2006.01)
*G06F 1/16* (2006.01)
*F16M 11/04* (2006.01)
*F16M 11/42* (2006.01)
*F16M 13/00* (2006.01)
*F16M 13/02* (2006.01)
*H04M 1/04* (2006.01)

(52) U.S. Cl.
CPC .......... *F16M 13/00* (2013.01); *F16M 13/022* (2013.01); *G01R 33/4806* (2013.01); *G06F 1/1632* (2013.01); *H04M 1/04* (2013.01)

(56) References Cited

U.S. PATENT DOCUMENTS

| | | | |
|---|---|---|---|
| 8,190,237 B2* | 5/2012 | Driemel | G01R 33/3415 |
| | | | 600/407 |
| 10,292,888 B2* | 5/2019 | Wilson | A61G 13/122 |
| 2008/0200796 A1 | 8/2008 | Graham et al. | |
| 2009/0308400 A1* | 12/2009 | Wilson | A61F 5/3769 |
| | | | 128/845 |
| 2012/0011653 A1 | 1/2012 | Coppens et al. | |
| 2014/0117174 A1 | 5/2014 | Tan et al. | |
| 2016/0120437 A1 | 5/2016 | Graham et al. | |

* cited by examiner

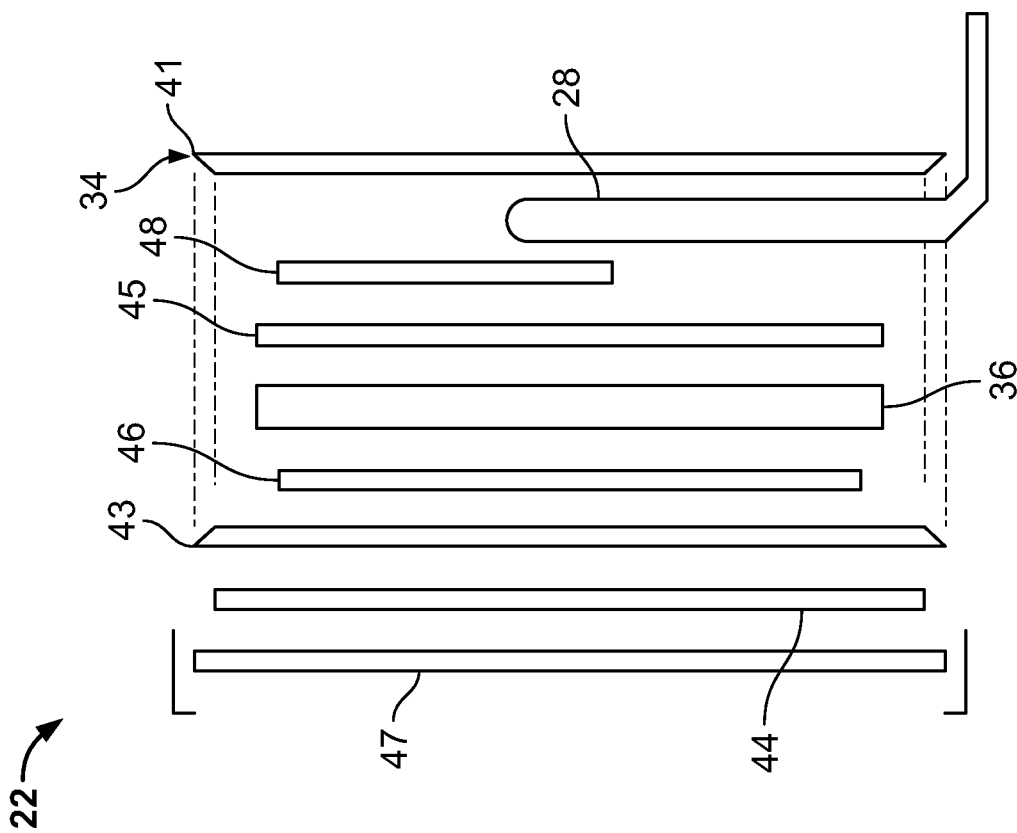
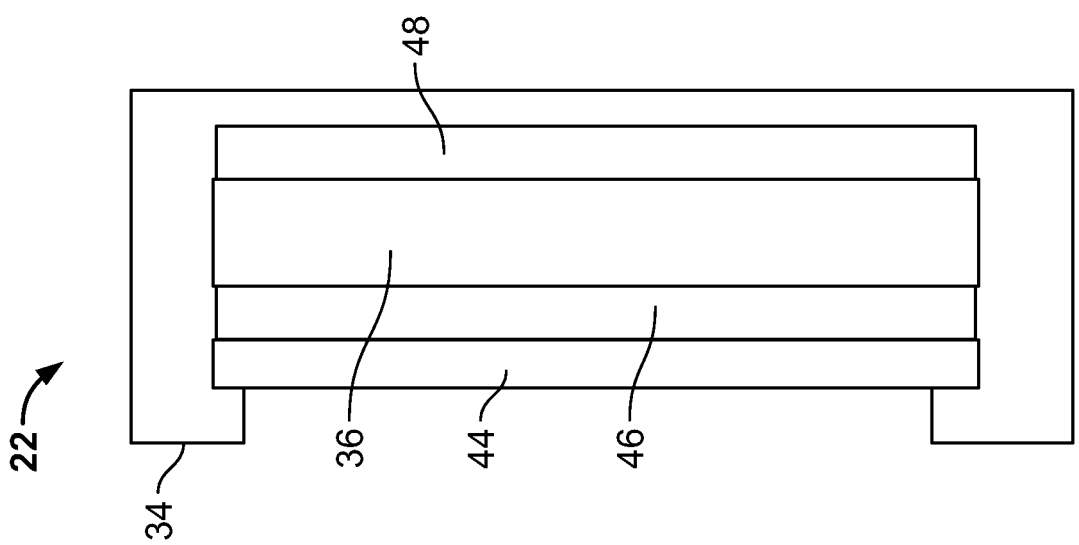

SUPPORT FOR AN ELECTRONIC TABLET FOR USE IN FUNCTIONAL MRI

CROSS-REFERENCE TO RELATED APPLICATIONS

This application is a U.S. National Stage Application under 35 U.S.C. § 371 of International Patent Application No. PCT/US2017/045242, filed Aug. 3, 2017, which claims the benefit of U.S. Provisional Application No. 62/370,436, which is entitled 'SUPPORT FOR AN ELECTRONIC TABLET FOR USE IN FUNCTIONAL MRI," and was filed on Aug. 3, 2016, the entire disclosures each of which is expressly incorporated herein by reference in its entirety.

TECHNICAL FIELD

The present invention relates generally to touch interface devices and more particularly to a tablet-sized real-time display with touch interface that can function in the bore of a Functional Magnetic Resonance Imaging ("fMRI") machine.

BACKGROUND

The relationships between visually guided motor actions (such as hand writing) and the accompanying brain activity may provide insight into psychological processes such as high-level cognition. For example, by better understanding the brain activity that occurs as a person exercises the motor skills necessary to perform handwriting with visual feedback (i.e., the person looks at the hand performing the hand writing), researchers may learn more about how people learn to write. Indeed, brain images obtained during visually guided motor activity may lead to more effective rehabilitation programs for neurologically impaired individuals (e.g., stroke survivors) and/or educational programs for language comprehension, visual thinking and mathematics, etc. All of this requires the capture of brain images of a subject at the same time the subject's performance of the visually guided motor activity is being recorded. In the handwriting context, brain scans must be obtained as the subject's visually guided handwriting is being recorded to correlate the scans with motor actions that generate the handwriting.

The primary means of brain imaging today is fMRI scanning. The fMRI machines produce extremely intense magnetic fields which render inoperable virtually all electronic devices in the vicinity of the bore of the scanner. Accordingly, earlier research into the interrelationships between neurological activity and motor actions omitted visual feedback. In the handwriting context, subjects were placed in an fMRI machine and scanned while they wrote onto a touchscreen placed outside of the bore of the machine. Although the subjects were being scanned as their handwriting was being simultaneously recorded, the handwriting was not visually guided (i.e., they could not watch their hand writing because it was outside the bore of the machine or they could only watch with the assistance of mirrors). Thus, the significance of visual feedback could not be adequately studied.

As such, there exists a need for a touchscreen device with real-time display capable of functioning in the strong electromagnetic field of an fMRI machine to enable researchers to simultaneously capture both visually guided hand actions and brain imaging data.

SUMMARY

According to one embodiment of the present disclosure, a system for recording visually guided motor activity within a bore of an fMRI machine is provided, comprising: a tablet configured for mounting within the bore of the fMRI machine, the tablet comprising a housing having a first opening, a touchscreen/display mounted within the housing for access through the first opening, a first shielding layer disposed over the touchscreen/display and spanning the first opening, a second shielding layer disposed between the first shielding layer and the touchscreen/display and spanning the first opening, and a receiver board, the housing being formed of an encasement material that reduces RF interference with the touchscreen/display and the receiver board; an interface box coupled to a controller configured to control operation of the touchscreen/display, the interface box being located remotely from the bore and comprising a transmitter board for processing signals from the controller and transmitting processed signals to the receiver board of the tablet; and a cable connected between the tablet and the interface box, the cable comprising a plurality of conductors to carrying signals between the receiver board and the transmitter board and a shielding braid surrounding the conductors. In one aspect of this embodiment, the encasement material of the housing is FR-4 composite material with copper cladding on both sides. In another aspect, the housing includes a 3D printed bottom plate and a 3D printed top plate that includes the first opening. In still another aspect, the first shielding layer is formed from silver plastic mylar material. In a variant of this aspect, the second shielding layer is formed from copper mesh material. In another aspect of this embodiment, the touchscreen/display is a touch-sensitive LCD display. In another aspect, the housing comprising a back wall, a forward wall, a pair of side walls, an upper wall and a lower wall, the walls being electrically joined together on interior and exterior sides using soldered copper tape. In a variant of this aspect, the forward wall includes the first opening and one of the side walls includes a second opening for receiving the cable. In a further variant of this aspect, the interior side of each wall is beveled at an intersection with an adjacent wall. In yet another aspect of this embodiment, the system further comprises a mounting bracket coupled to the tablet housing and a support configured to mount within the bore and support the mounting bracket. In a variant of this aspect, the support comprises a pair of curved braces coupled to a channel and a pair of lower braces, the channel including a C-shaped opening configured to slidably receive the mounting bracket. In another variant, the support further comprises a tab connected to each lower brace and configured to couple the support to the fMRI machine. In still another variant, the mounting bracket comprises an insert sized to fit within the C-shaped opening and a mounting plate attached to a back wall of the tablet housing. In another aspect of this embodiment, the cable comprises a plurality of Ethernet cable sections. In another aspect, the shielding braid is formed from copper. In yet another aspect, the cable further comprises an outer nylon jacket braid surrounding the shielding braid. In still another aspect, the receiver board and the transmitter board each include a plurality of buffers.

In another embodiment of the present disclosure, a tablet assembly for recording visually guided motor activity within a bore of an fMRI machine is provided, comprising: a tablet configured for mounting within the bore of the fMRI machine, the tablet comprising a housing having a first opening, a touchscreen/display mounted within the housing for access through the first opening, at least one shielding layer disposed over the touchscreen/display and spanning the first opening, and a receiver board, the housing being formed of an encasement material that reduces RF interference with the touchscreen/display and the receiver board; an interface box located remotely from the bore and comprising a transmitter board for transmitting signals to the receiver board of the tablet; and a cable connected between the tablet and the interface box, the cable comprising a plurality of conductors to carrying signals between the receiver board and the transmitter board and a shielding braid surrounding the conductors. In one aspect of this embodiment, the encasement material of the housing is FR-4 composite material with copper cladding on both sides. In another aspect, the at least one shielding layer comprises a silver plastic mylar layer and a copper mesh layer. In another aspect, the tablet assembly further comprises a mounting bracket coupled to the tablet housing and configured to couple to a support mounted within the bore. In still another aspect of this embodiment, the cable comprises a plurality of Ethernet cable sections and a nylon jacket braid surrounding the shielding braid.

According to a further embodiment of the present disclosure, a method of studying brain activity associated with visually guided motor activity is provided, comprising: locating a patient in a bore of an fMRI machine; locating a tablet in the bore, the tablet comprising a touchscreen/display within reach and line of sight of the patient; instructing the patient to perform a visually guided motor activity through interaction with the touchscreen/display; and simultaneously recording the interaction with the touchscreen/display and scanning the brain of the patient with the fMRI machine.

In yet another embodiment of the present disclosure, a support for a tablet for use in a Functional Magnetic Resonance Imaging (fMRI) machine is provided, and includes a plurality of curved braces configured to mount within a bore of the fMRI machine; a channel coupled to one end of the curved braces; and a pair of lower braces coupled to another end of the curved braces; wherein the channel includes a C-shaped opening configured to receive a mounting bracket coupled to the tablet. In one aspect of this embodiment, the channel is coupled to the one end of the curved braces by a pair of channel braces. In another aspect, the plurality of curved braces includes a first curved brace including a first section and a second section, and a second curved brace including a first section and a second section. In another aspect, the first section of the first curved brace is coupled between the channel and a first lower brace, the second section of the first curved brace is coupled between the channel and a second lower brace, the first section of the second curved brace is coupled between the channel and the first lower brace, and the second section of the second curved brace is coupled between the channel and the second lower brace. In still another aspect, the support includes a tab connected to each lower brace and configured to couple the support to the fMRI machine. In yet another aspect of this embodiment, the C-shaped opening is sized to slidably receive the mounting bracket to permit adjustable positioning of the mounting bracket along a length of the channel. In yet still another aspect, the mounting bracket includes an insert mounted to a top plate connected to braces. In a variant of this aspect, the support includes a mounting plate attached to a housing of the tablet and connected to the top plate and the braces. In another variant of this aspect, the insert is sized to be received in the C-shaped opening of the channel. In still another variant of this aspect, the tablet is positionable at any location along the length of the channel using a sliding interface between the insert and the C-shaped opening.

In still another embodiment of the present disclosure, a support for a tablet for use in a Functional Magnetic Resonance Imaging (fMRI) machine is provided, and includes a first curved brace and a second curved brace, both being configured to fit within a bore of the fMRI machine; a pair of channel braces connecting the first curved brace and the second curved brace; a channel coupled to the first and second curved braces; and a pair of lower braces coupled to ends of the first and second curved braces; wherein the channel includes an opening configured to receive a mounting bracket coupled to the tablet. In one aspect of this embodiment, the channel includes an upper wall and a pair of side walls, which together form the opening. In another aspect of this embodiment, the opening is sized to slidably receive at least a portion of the mounting bracket. In yet another aspect of this embodiment, the support is integral to the fMRI machine for providing a support structure that conforms to an interior of the fMRI machine. In still another aspect of this embodiment, the channel is connected between the pair of chancel braces. In yet still another aspect of this embodiment, the first curved brace is connected to one end of the pair of channel braces, and is connected to one end of the pair of lower braces. In a variant of this aspect, the second curved brace is connected to the other end of the pair of channel braces, and is connected to the other end of the pair of lower braces. In another variant of this aspect, the first curved brace includes a first section and a second section, and the second curved brace includes a third section and a fourth section. In yet another variant of this aspect, the first section and the third section extend substantially in parallel between one of the pair of lower braces and one of the pair of channel braces. In still yet another variant of this aspect, the second section and the fourth section extend substantially in parallel between the other of the pair of lower braces and the other of the pair of channel braces.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

BRIEF DESCRIPTION OF THE DRAWINGS

The above-mentioned and other features of this disclosure and the manner of obtaining them will become more apparent and the disclosure itself will be better understood by reference to the following description of embodiments of the present disclosure taken in conjunction with the accompanying drawings, wherein:

FIGS. 6 and 7 are side, cross-sectional views of the tablet of FIG. 2;

Figure 1:
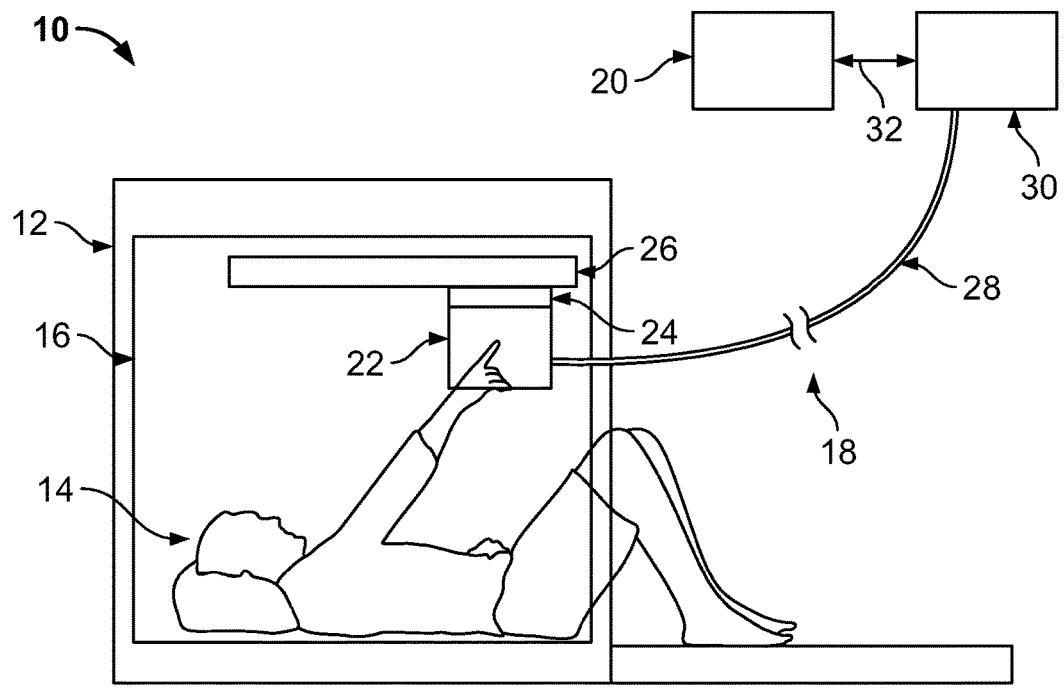
FIG. 1 is a conceptual drawing of a system for simultaneously recording motor activity and scanning brain activity according to one embodiment of the present disclosure.

While the present disclosure is amenable to various modifications and alternative forms, specific embodiments have been shown by way of example in the drawings and are described in detail below. The present disclosure, however, is not to limit the particular embodiments described. On the contrary, the present disclosure is intended to cover all modifications, equivalents, and alternatives falling within the scope of the appended claims.

DETAILED DESCRIPTION

The embodiments disclosed below are not intended to be exhaustive or to limit the disclosure to the precise forms disclosed in the following detailed description. Rather, the embodiments are chosen and described so that others skilled in the art may utilize their teachings.

One of ordinary skill in the art will realize that the embodiments provided can be implemented in hardware, software, firmware, and/or a combination thereof. For example, the controller disclosed herein may form a portion of a processing subsystem including one or more computing devices having memory, processing, and communication hardware. The controller may be a single device or a distributed device, and the functions of the controller may be performed by hardware and/or as computer instructions on a non-transient computer readable storage medium. For example, the computer instructions or programming code in the controller may be implemented in any viable programming language such as C, C++, HTML, XTML, JAVA or any other viable high-level programming language, or a combination of a high-level programming language and a lower level programming language. As is further described herein, the device of the present disclosure may use the interactive features of traditional desktop operating systems (e.g., Windows®, OS X) or interactive touch-enabled operating systems (e.g., Android, iOS).

The aspects of the present disclosure are described herein primarily in the context of understanding the learning processes associated with handwriting. It should be understood, however, that the device and methods disclosed herein may have application to research in a variety of other areas such as stroke patient rehabilitation, prosthetic use and control, the neurological effects of video gaming, and concussion research to name a few. In each of these areas of research, a subject may be asked to perform a visually guided motor activity that is captured electronically within the bore of an fMRI machine where the neurological activity of the subject is recorded simultaneously via the fMRI's brain imaging functionality. It should also be understood that the disclosed device and methods may be employed to provide entertainment to patients during long fMRI scans by enabling stylus or touch-based interaction with a video game within the bore of the magnet. Moreover, the touch and display capabilities of the present disclosure may be used separately or together in the manner that a computer mouse functions when the monitor is disabled or the monitor functions when the mouse is unplugged.

Referring now to FIG. 1, a system 10 according to one embodiment of the present disclosure generally includes an fMRI machine 12 for obtaining brain images of a subject 14 situated within the bore 16 of the machine, a tablet assembly 18 and a computer or controller 20. fMRI machine 12 may be any of a variety of devices including, but not limited to, a Siemens TIM Trio 3Tesla scanner, which use magnetic fields to generate scans of structures internal to the subject's 14 body, such as the brain, according to principles that are known in the art. The magnetic fields are extremely intense within bore 16 of machine 12. As is shown in FIG. 1, subject 14 is normally lying on his or her back while in bore 16.

Tablet assembly 18 generally includes a tablet 22, a mounting bracket 24 connected to tablet 22, a support 26 for supporting mounting bracket 24, and a cable 28 coupled between tablet 22 and an interface box 30. As is further described herein, interface box 30 communicates with controller 20 over communication link 32. As shown in the figure, tablet 22 is supported within bore 16 by mounting bracket 24 and support 26 such that the subject 14 may interact with tablet 22 while watching his or her motor actions thereby providing visual feedback during the motor tasks. Cable 28 connecting tablet 22 and interface box 30 is long enough to permit interface box 30 to be located a distance from bore 16 that prevents unacceptable disturbance of the electronics functions of interface box 30 by the magnetic fields generated within bore 16 by fMRI machine 12. Controller 20 is also positioned a safe distance away from bore 16.

As is further described herein, a general concept of the present disclosure is to locate as much of the electronics used to operate tablet 22 a safe distance away from the strong magnetic field of fMRI machine 12. Conventional tablets require substantial circuitry to convert the signals sent out by controller 20 (normally over an HDMI, DIV or VGA cable) into actual red, green and blue pixels turning on and off in the right location at the correct time. According to the present disclosure, much of this circuitry is located far from fMRI machine 12 in interface box 30, but still functions as desired in part through the use of special cabling and buffering of signals.

Figure 2:
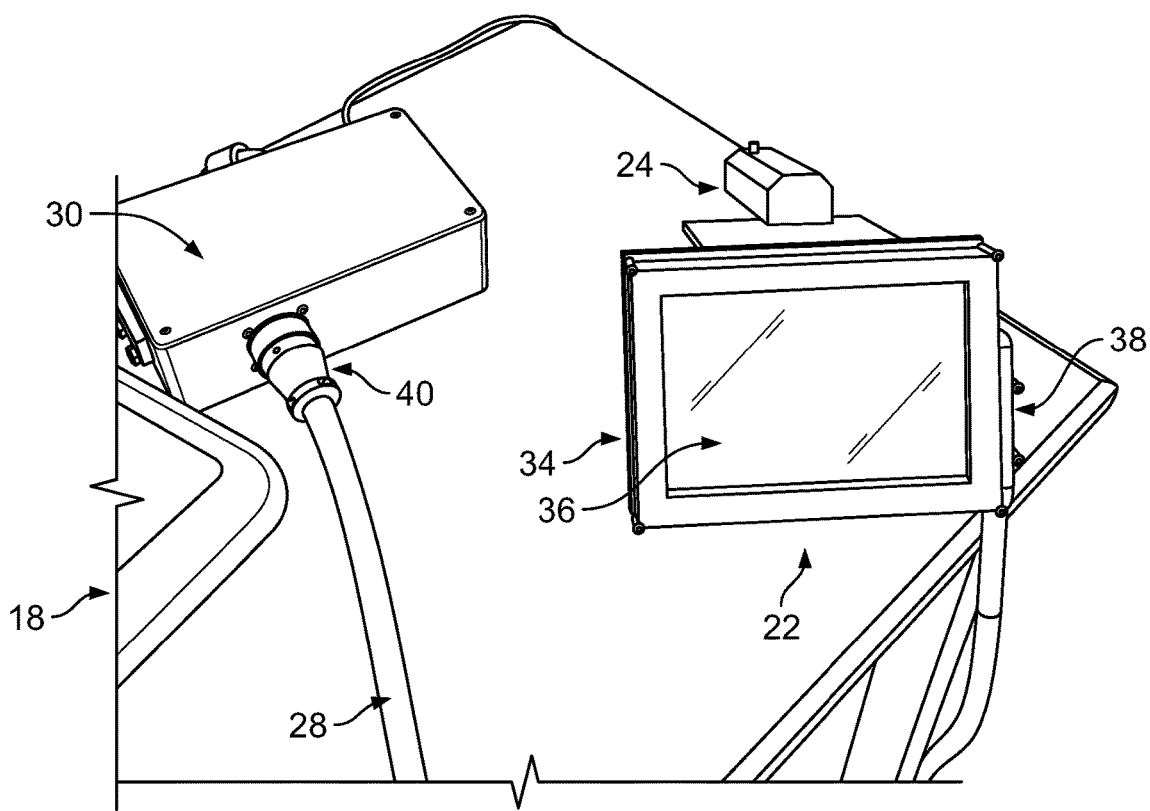
FIG. 2 is a perspective view of a tablet assembly according to one embodiment of the present disclosure.
Figure 3:
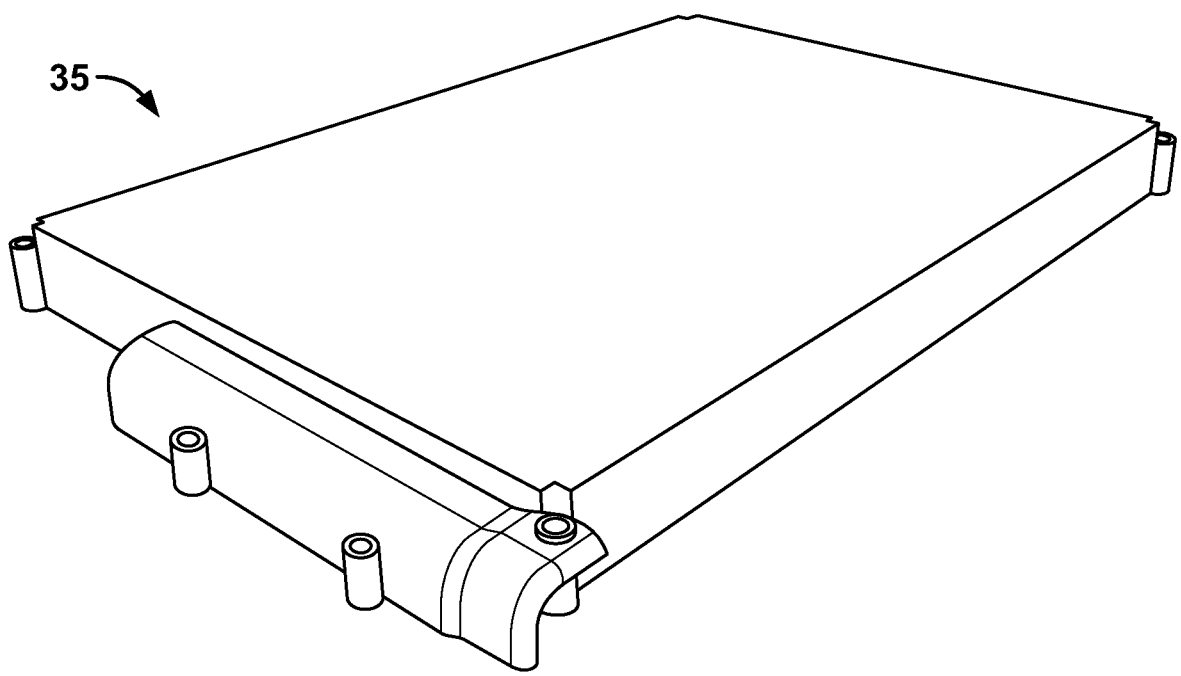
FIG. 3 is a perspective view of a portion of a housing for a touchscreen device with real-time display (hereinafter, a "tablet") according to one embodiment of the present disclosure.
Figure 4:
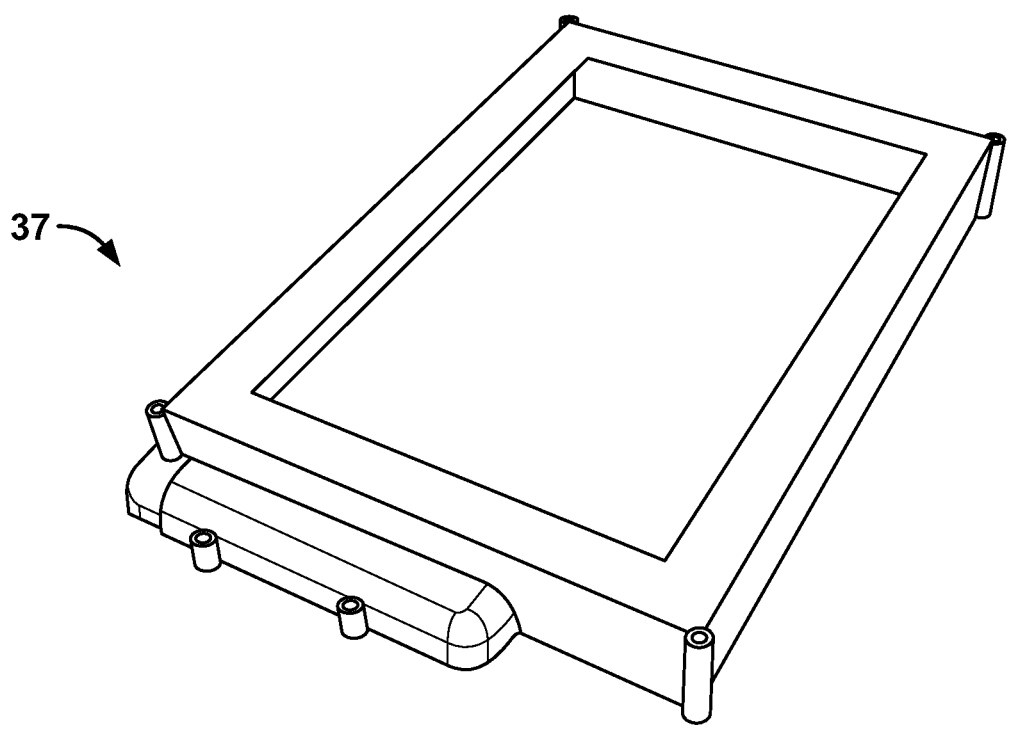
FIG. 4 is a perspective view of another portion of the housing for a tablet.
Figure 5:
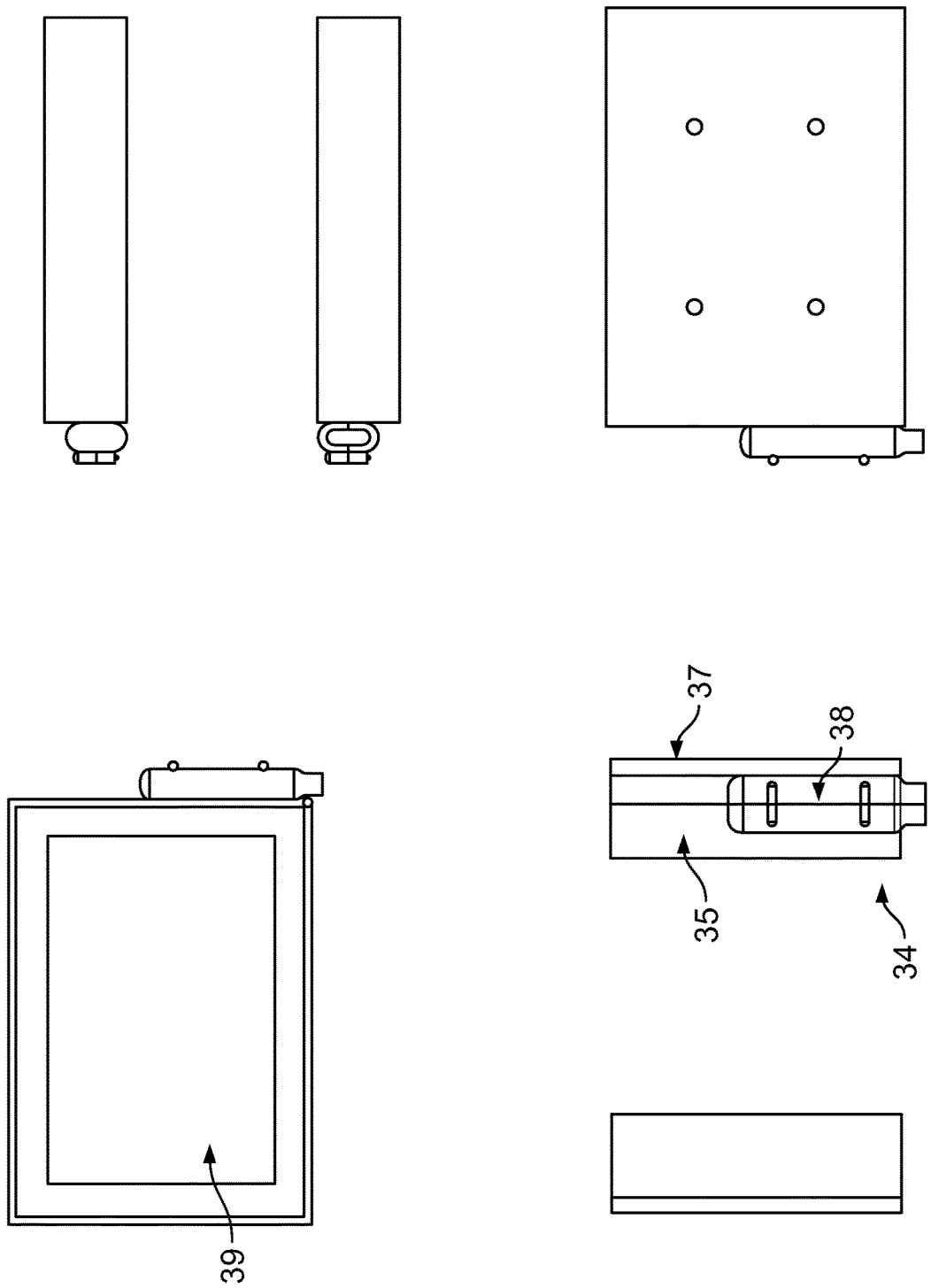
FIG. 5 provides multiple views of a tablet housing according to the present disclosure.

Referring now to FIG. 2, tablet 22 and interface box 30 are shown connected by cable 28. Tablet 22 generally includes a housing 34, a touchscreen/display 36, and a stress-relief 38 configured to retain cable 28. Mounting bracket 24 is shown mounted to housing 34. Cable 28 is shown connected to interface box 30 using a connector 40. As is further described below, housing 34 may be formed of an encasement material that reduces possible RF interference such as FR-4 composite material (i.e., circuit board material) with ½ ounce copper-clad on both sides. Different encasement materials for housing 34, touchscreen/display 36 and cable 28 to reduce possible RF and magnetic interference may include carbon fiber, carbon sheets, carbon granules, stainless steel, bronze and magnesium. FIGS. 3-5 show another embodiment of housing 34 which includes a 3D printed bottom plate 35 and a 3D printed top plate 37 that mates with bottom plate 35 which together form stress-relief 38 and provide an opening 39 for touchscreen/display 36.

Referring now to FIG. 6, tablet 22 is conceptually depicted as including a touchscreen/display 36, a first shielding layer 44, a second shielding layer 46 and a receiver board 48 encased within housing 34. The materials and connections of first shielding layer 44, second shielding layer 46 and housing 34 are selected to prevent interference by (and to) fMRI machine 12 with the electrical operation of touchscreen/display 36 and receiver board 48 as is further described below. In one embodiment, first shielding layer 44 is formed from an RF blocking silver plastic mylar material such as SaniSilver™ made by Less EMF, Inc. In one embodiment, second shielding layer 46 is formed from a very fine copper mesh such as VeilShield™ made by Less EMF, Inc. In other embodiments, an RF resistant glass with a copper coating on the inside may be used in place of first shielding layer 44 and second shielding layer 46. While in certain embodiments touchscreen/display 36 is described as a touch-sensitive LCD display, in other embodiments an LED or other display may be used.

FIG. 7 depicts further details of tablet 22. Housing 34 is shown including a back wall 41, a forward wall 43 and upper and lower walls (shown in dashed lines). Cable 28 extends from within housing 34 (i.e., from receiver board 48) to interface box 30. Touchscreen/display 36 is shown mounted within housing 34 backed by an RF absorbent paper 45 and receiver board 48. Second shielding layer 46 including fine micro copper netting is disposed in front of touchscreen/display 36. First shielding layer 44 including silver mylar is mounted to forward wall 43 of housing 34. Finally, a touchscreen 47 is mounted to first shielding layer 44.

Referring now to FIGS. 8-11, one embodiment of housing 34 is shown. In this embodiment, housing 34 is made from FR-4 composite material (0.1524 cm thick) such as that of a double sided PC board. Housing 34 generally includes back wall 41, forward wall 43 (as discussed above), side walls 51, 53, upper wall 55 and lower wall 57. In this embodiment, walls 41, 43, 51, 53, 55, 57 are electrically joined together on their interior and exterior sides using soldered copper tape and other materials as described below. Forward wall 43 includes opening 39. Side wall 51 includes an opening 59 for cable 28. In one embodiment, housing 34 is 17.145×12.065×3.175 cm in size and includes the six components listed above. The inside face of each wall is beveled 61 at a 45 degree angle to reduce gaps that could permit passage of RF noise. In the depicted embodiment, opening 39 is 14.24×10.16 cm.

Figure 9:
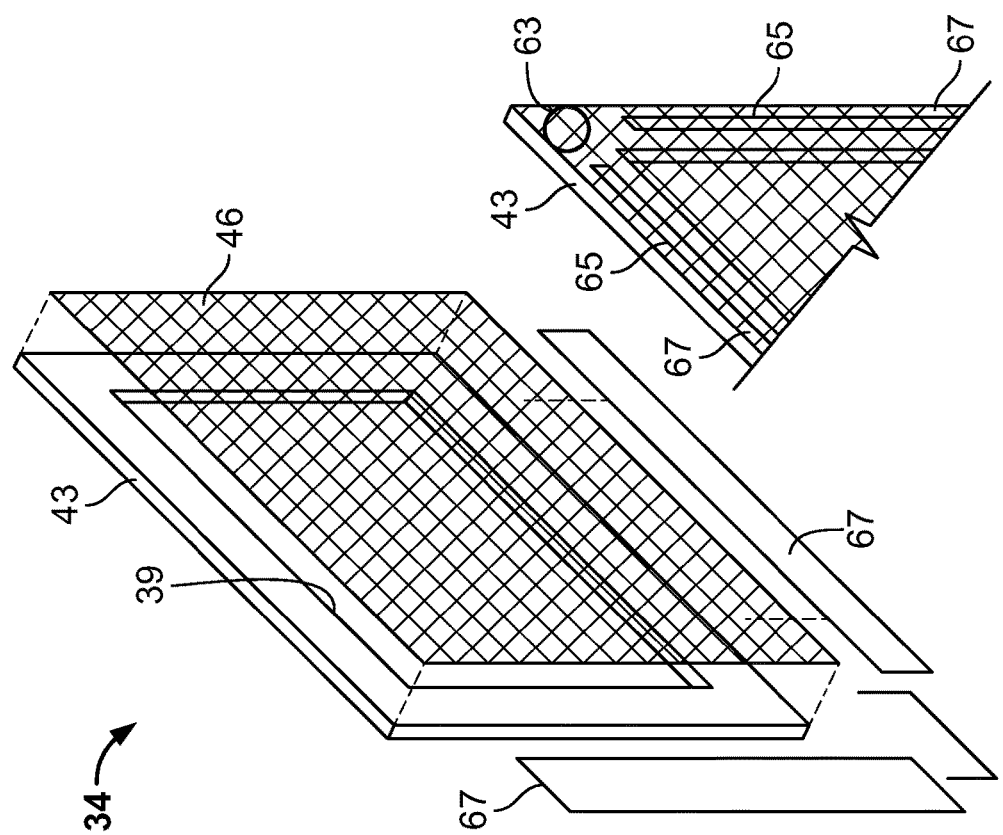
FIG. 9 is a perspective view of a portion of the tablet housing depicted in FIG. 8.
Figure 8:
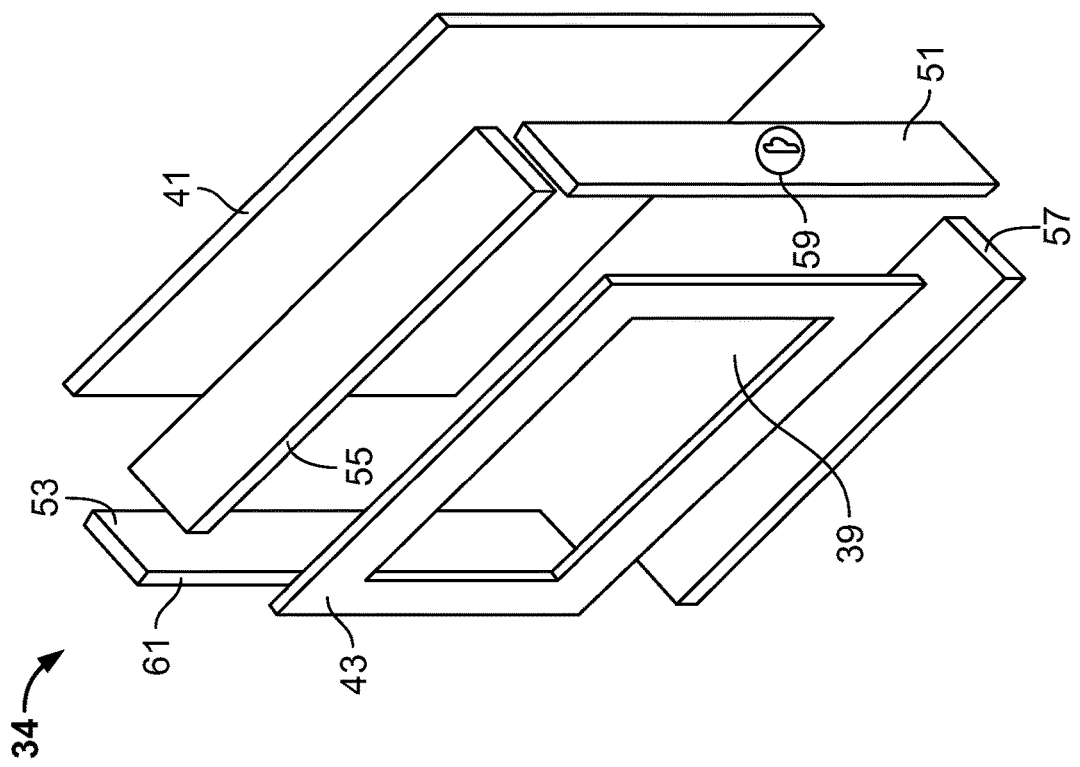
FIG. 8 is an exploded, perspective view of a tablet housing according to the present disclosure.

As best shown in FIG. 9, second shielding layer 46 is positioned across opening 39 on the inside face of forward wall 43. The fine copper net of layer 46 is fine enough to see through but still effective in blocking RF signals generated by fMRI machine 12. Layer 46 is attached to forward wall 43 using silver solder 63 and conductive glue/paint 65. A polyimide tape barrier 67 is placed over the edges of layer 46 around its perimeter. Barrier 67 is an insulator and prevents the electrical ground of tablet 22 from contacting touchscreen/display 36 and protects touchscreen/display 36 from heat generated by potential current loops.

Figure 10:
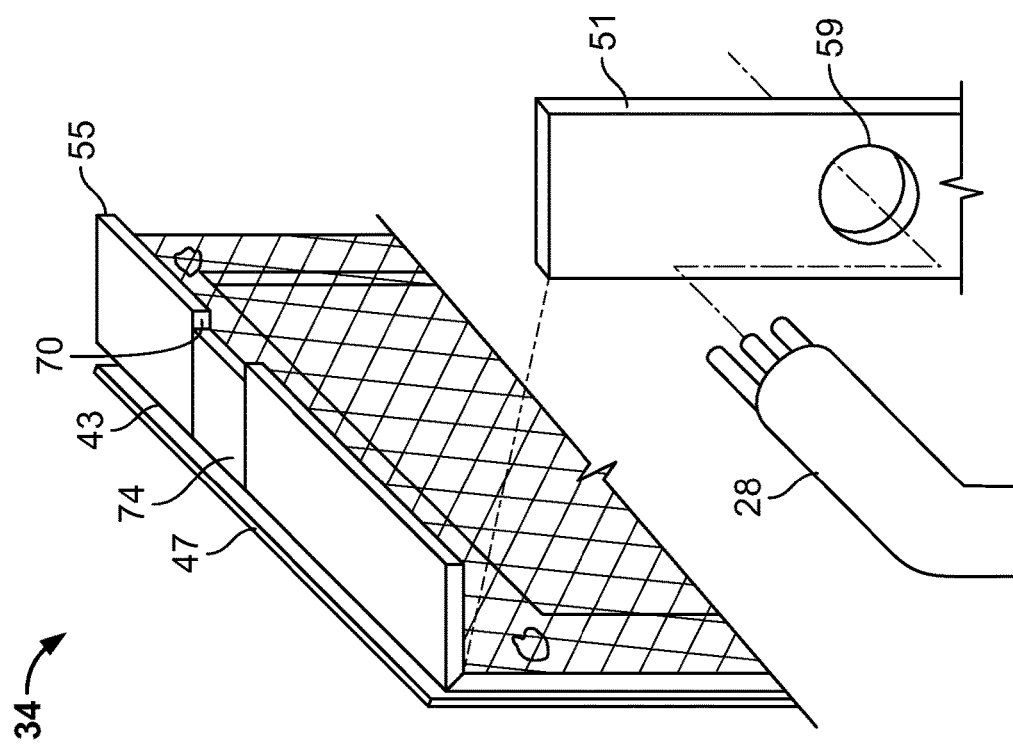
FIG. 10 is a perspective view of another portion of the tablet housing depicted in FIG. 8.

Referring now to FIG. 10, opening 59 is shown in side wall 51 and in one embodiment has a diameter of 1.5875 cm for receiving cable 28. All four walls 51, 53, 55, 57 are soldered to the inside of forward wall 43, ensuring that the copper on the inside of the walls does not contact the copper on the outside of the walls. Conductive glue 65 is then used to seal off any inside seams. A notch 70 is formed into upper wall 55 (approximately 0.9525×0.9525 cm) to receive the cable 72 (FIG. 11) of touchscreen 47. Copper tape is installed along the outside edges of housing 34 and soldered into place. A piece of RF absorbent material 74 is placed on upper wall 55 from forward wall 43 to notch 70. When tablet 22 is fully assembled, another piece of RF material 76 (FIG. 11) is placed on top of cable 72 of touchscreen 47.

Figure 11:
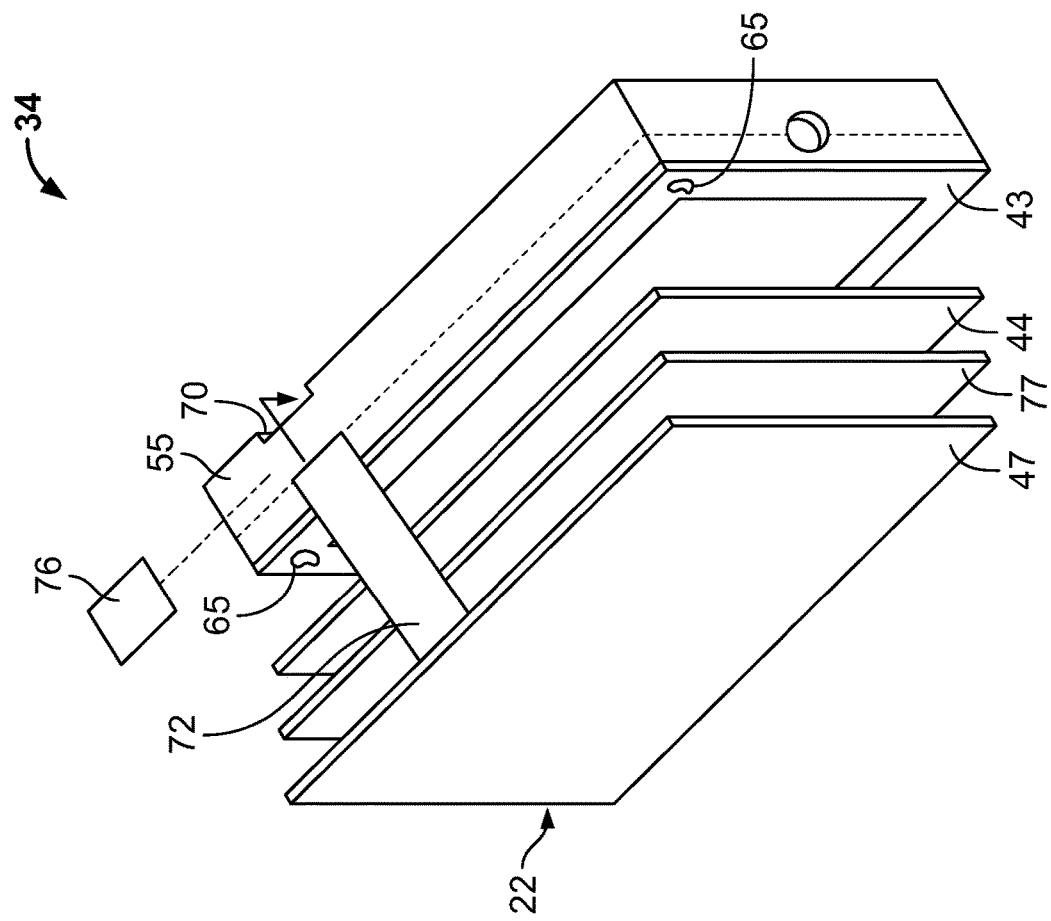
FIG. 11 is an exploded, perspective view of a tablet according to the present disclosure.

Referring now to FIG. 11, first shielding layer 44 of silvered mylar (a section approximately 17.145×12.065 cm) is placed across forward wall 43. The conductive side of layer 44 is positioned to make contact with the copper face of forward wall 43. Conductive glue 65 is placed at each of the four corners of forward wall 43. Next, a faceplate 77 (a super clear polycarbonate panel of approximately 0.15875× 17.145×12.065 in dimension) is placed on top of layer 44. Faceplate 77 inhibits flexing of touchscreen 47 and provides improved tracking. Faceplate 77 is connected to layer 44 using polyimide tapes around its outside edges. Finally, touchscreen 47 is installed and connected.

Figure 12:
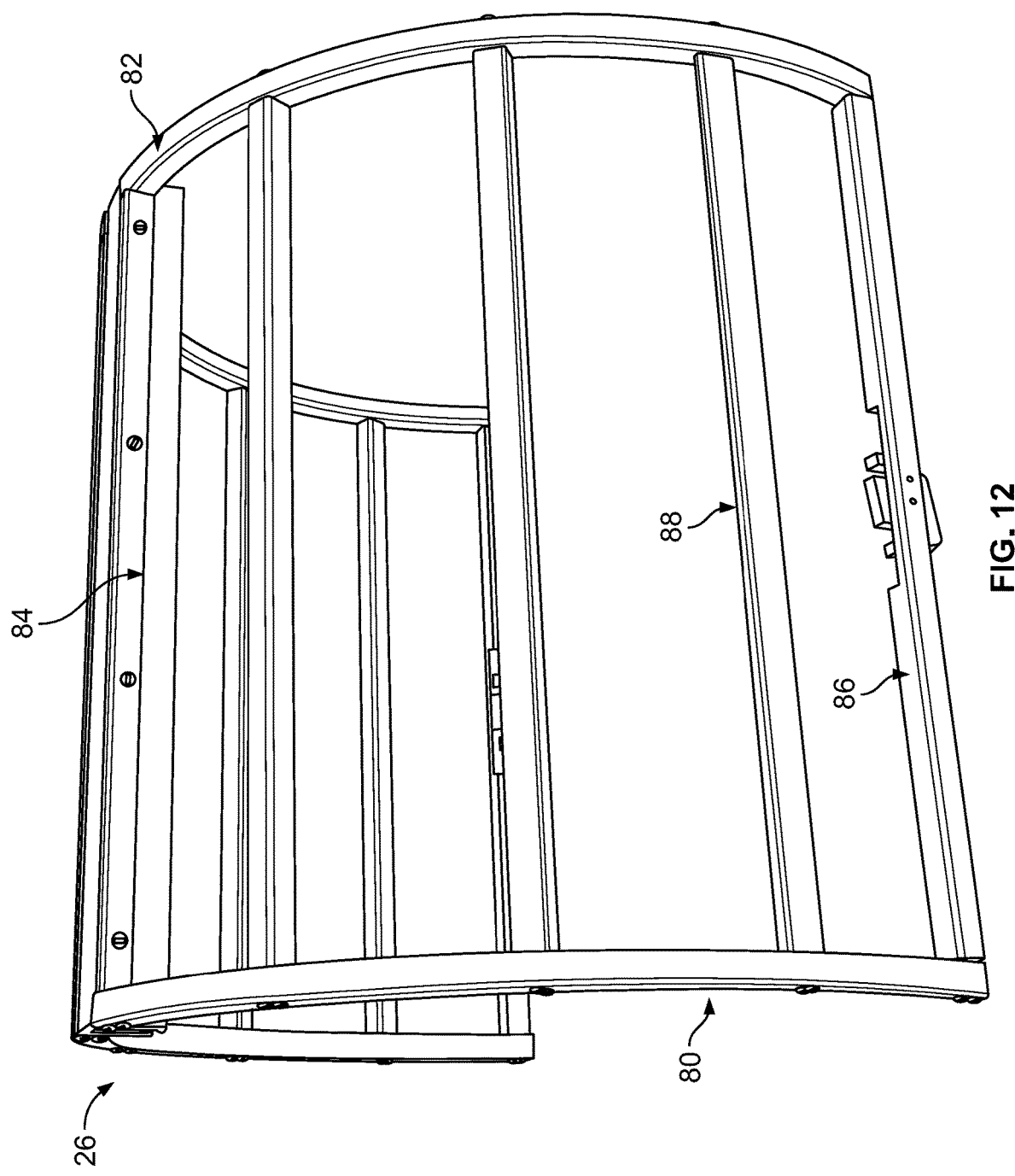
FIGS. 12 and 13 are perspective views of a support according to the present disclosure.
Figure 13:
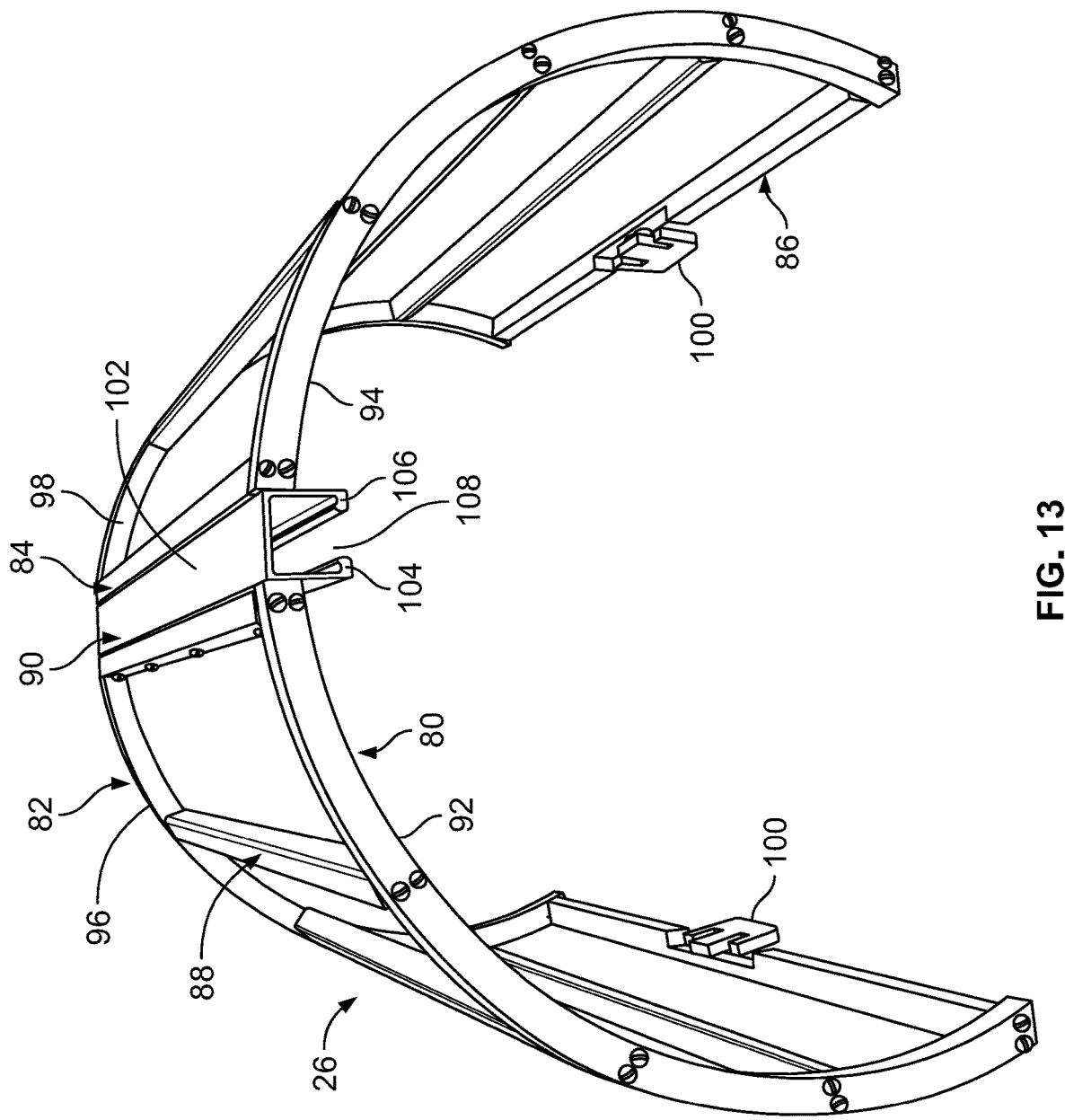

Referring now to FIGS. 12 and 13, support 26 is shown. As typical MRI machines are expensive and produced without means for supporting tablet 22, the present disclosure provides a retrofit support 26 to eliminate the need to modify standard fMRI machines 12. While support 26 is described herein as being mounted within bore 16 of an unmodified fMRI machine 12, it should be understood that support 26 may be integral to fMRI machine 12 in other embodiments without departing from the teachings of the present disclosure. Support 26 of the present disclosure is formed to fit within bore 16 and thus provides a semicircular support structure that conforms to the interior of fMRI machine 12 and couples to the existing structure.

As shown in FIGS. 12 and 13, support 26 generally includes a curved brace 80, a curved brace 82, a pair of channel braces 84, a pair of lower braces 86 and a plurality of cross braces 88 extending between curved braces 80, 82. Support 26 further includes a channel 90 connected between channel braces 84. As best shown in FIG. 13, curved brace 80 includes a first section 92 and a second section 94, each extending between a lower brace 86 and a channel brace 84. Similarly, curved brace 82 includes a first section 96 and a second section 98, each extending between a lower brace 86 and a channel brace 84. A tab 100 is connected to each lower brace 86 and configured to mate with a connector within bore 16 of fMRI machine 12 to fix support 26 in place. Channel 90 includes an upper wall 102 and a pair of side walls 104, 106, which together form a C-shaped opening 108 sized to slidably receive a portion of mounting bracket 24 as is further described below.

Figure 14:
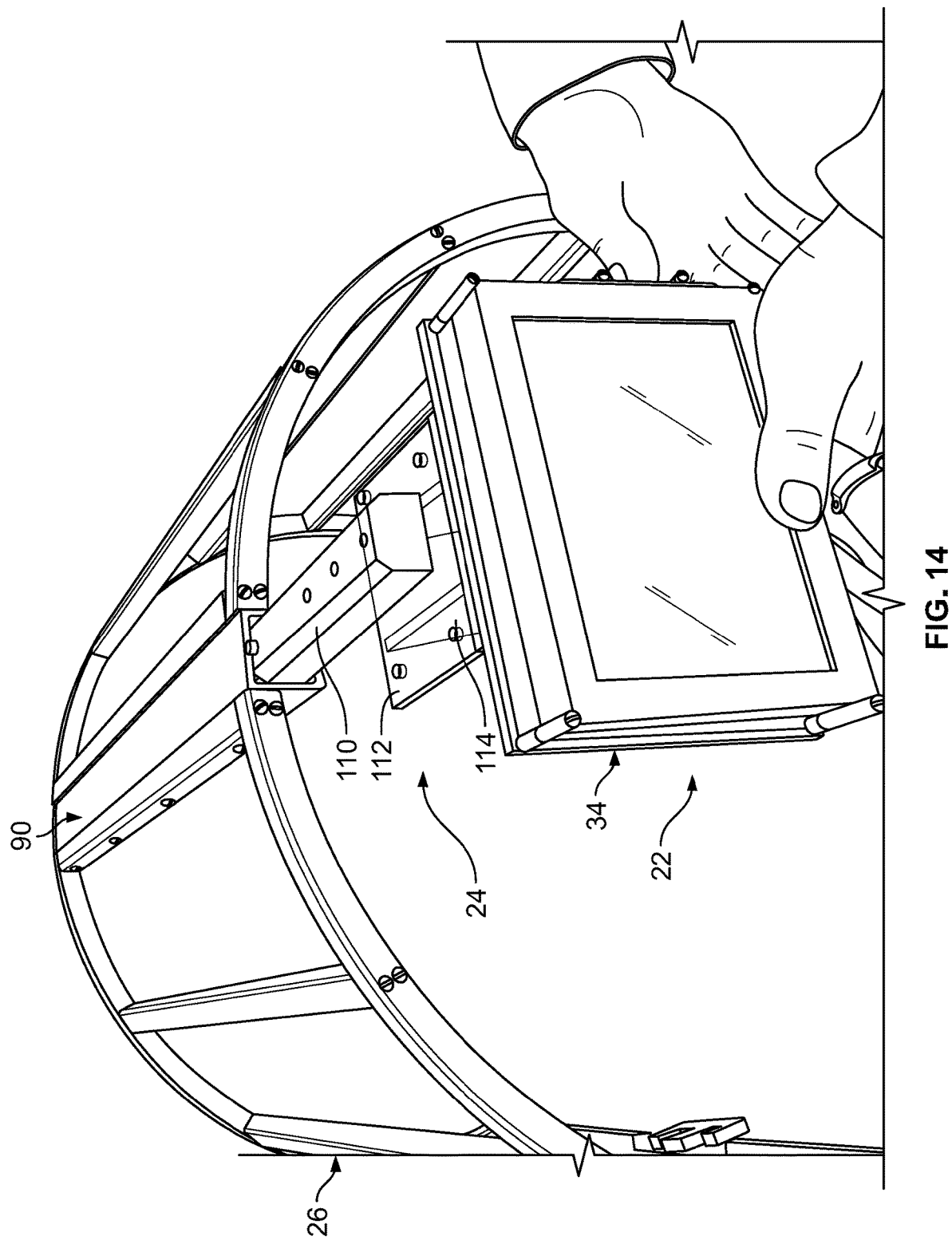
FIGS. 14-16 are perspective views depicting attachment of the tablet of FIG. 2 to the support of FIGS. 12 and 13.
Figure 15:
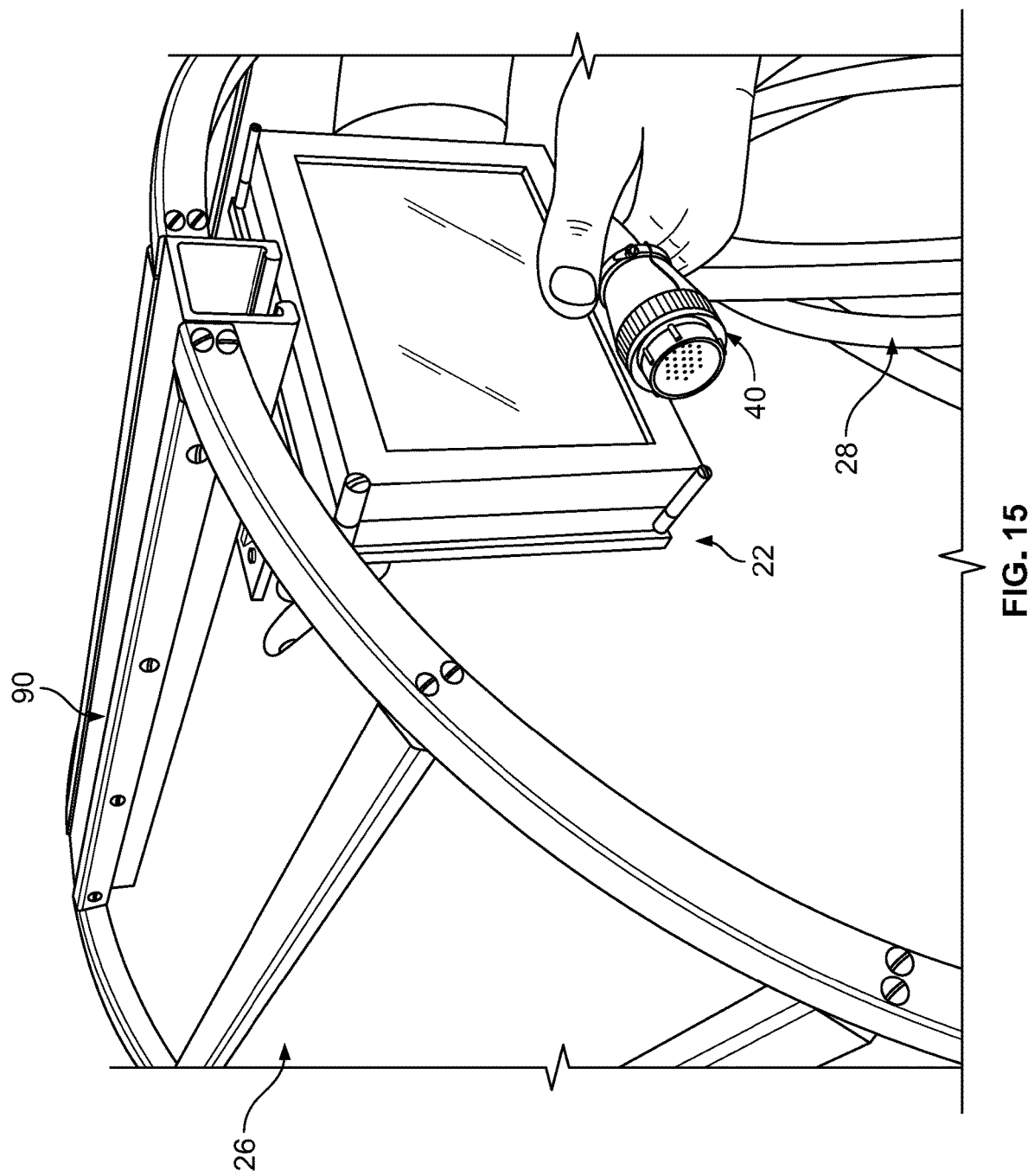
Figure 16:
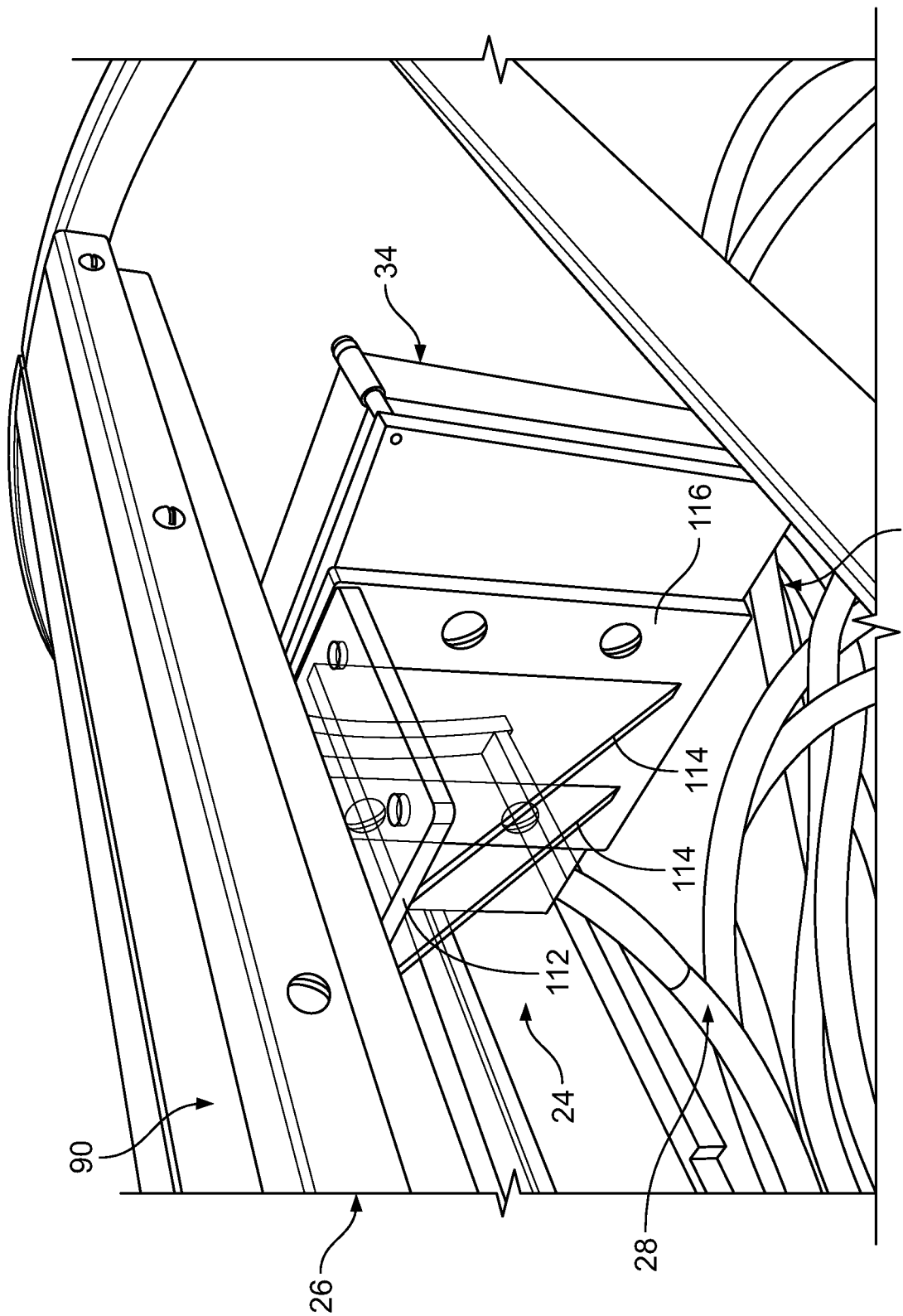

Referring now to FIGS. 14-16, mounting bracket 24 includes an insert 110 mounted to a top plate 112. Top plate 112 is connected to braces 114. As best shown in FIG. 16, a mounting plate 116 attached to housing 34 of tablet 22 is connected to top plate 112 and braces 114. As best shown in FIG. 14, insert 110 is sized to be received in opening 108 of channel 90. The sliding interface between insert 110 and opening 108 permits tablet 22 to be positioned at any location along the length of channel 90. While a particular embodiment of mounting bracket 24 is described, it should be understood that mounting bracket 24 may have a variety of acceptable configurations. The function of slidably connecting tablet 22 to channel 90 for adjustable positioning of tablet 22 may be carried out in many ways. Additionally, mounting bracket 24 may be configured in certain embodiments to permit tablet 22 to tilt, swivel, or otherwise assume various orientations.

Figure 17:
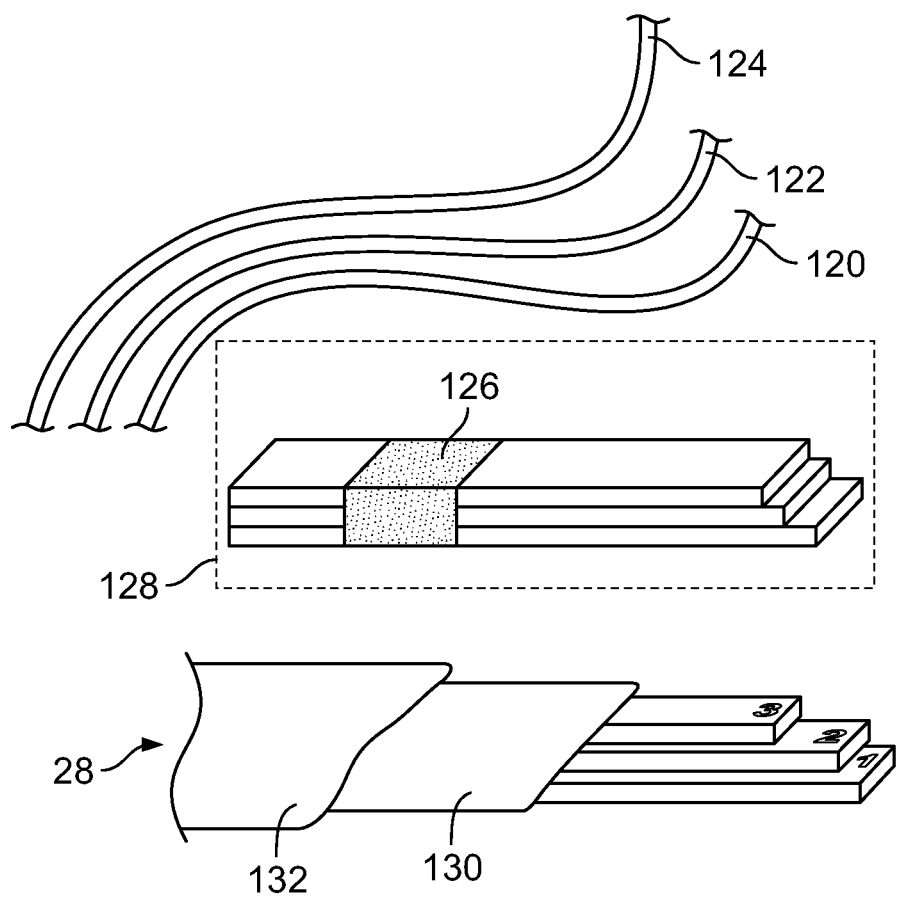
FIGS. 17-19 are perspective views of a cable of the tablet assembly of FIG. 2 at various stages of construction.
Figure 18:
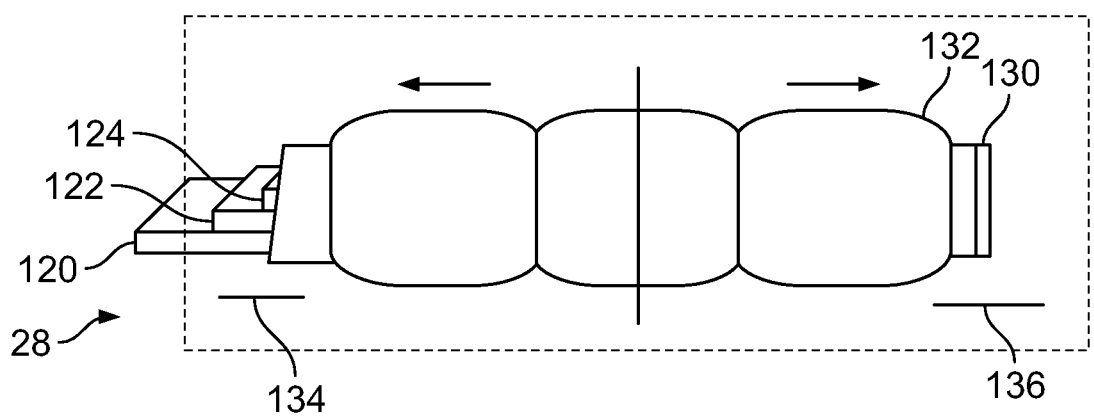
Figure 19:
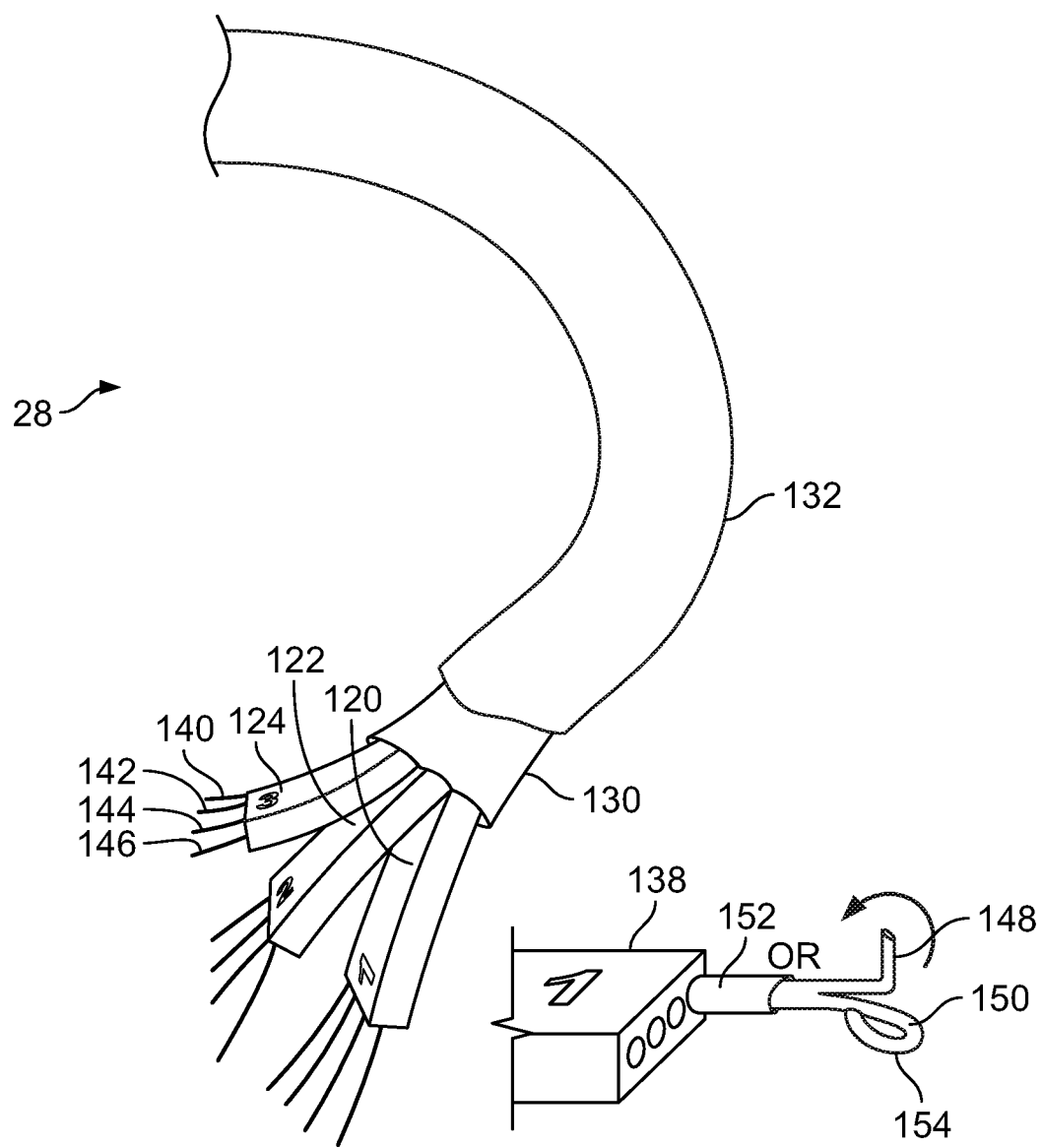
Figure 20:
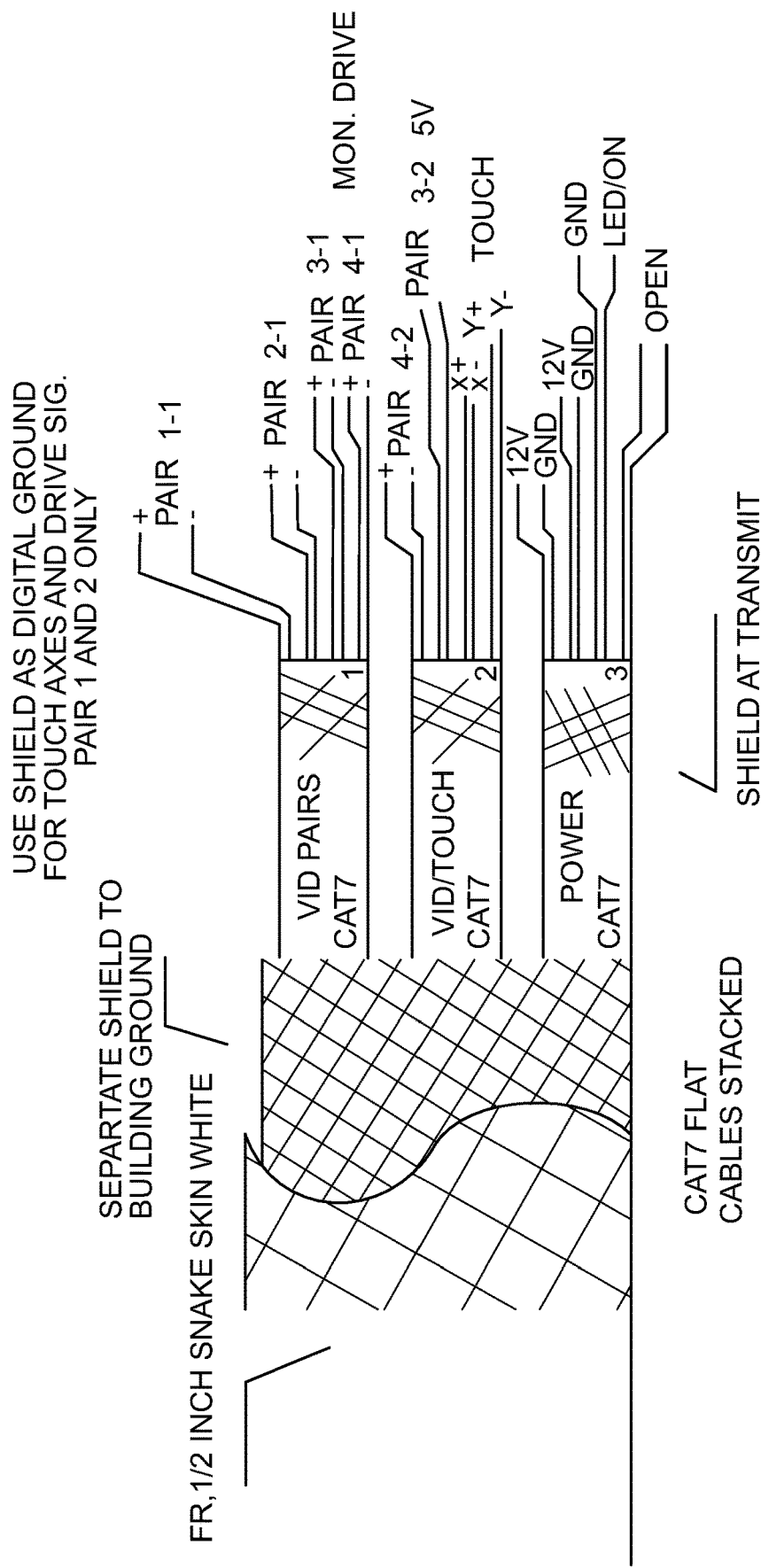
FIG. 20 is a schematic view of the cable of FIGS. 17-19.

Referring now to FIGS. 17-19, details of construction of one embodiment of cable 28 are shown. As best shown in FIG. 17, the electrically conductive component of cable 28 includes three identical Cat7 Ethernet cable sections 120, 122, 124. Sections 120, 122, 124 are stacked on one another and bound with tape 126, thereby forming a cable assembly 128. Cable assembly 128 is then pushed through a section of copper shielding braid 130 and an outer nylon jacket braid 132. As shown in FIG. 18, the braids 130, 132 are pushed back at ends 134, 136 of cable 28 after assembly is complete to expose the ends of cable sections 120, 122, 124. The ends of cable sections 120, 122, 124 are then stripped and connected to receiver board 48 and connector 40 in the manner described below. When the jacket 138 of each cable section 120, 122, 124 is removed as shown in FIG. 19, four wires 140, 142, 144, 146, each having two conductors 148, 150, are exposed. The insulation 152 of each wire 140, 142, 144, 146 is stripped to expose conductors 148, 150. Conductors 148, 150 are then folded back upon themselves and solder 154 is applied to prepare conductors 148, 150 for connection to receiver board 48 and connector 40. A wiring diagram of cable 28 is depicted in FIG. 20.

Figure 21:
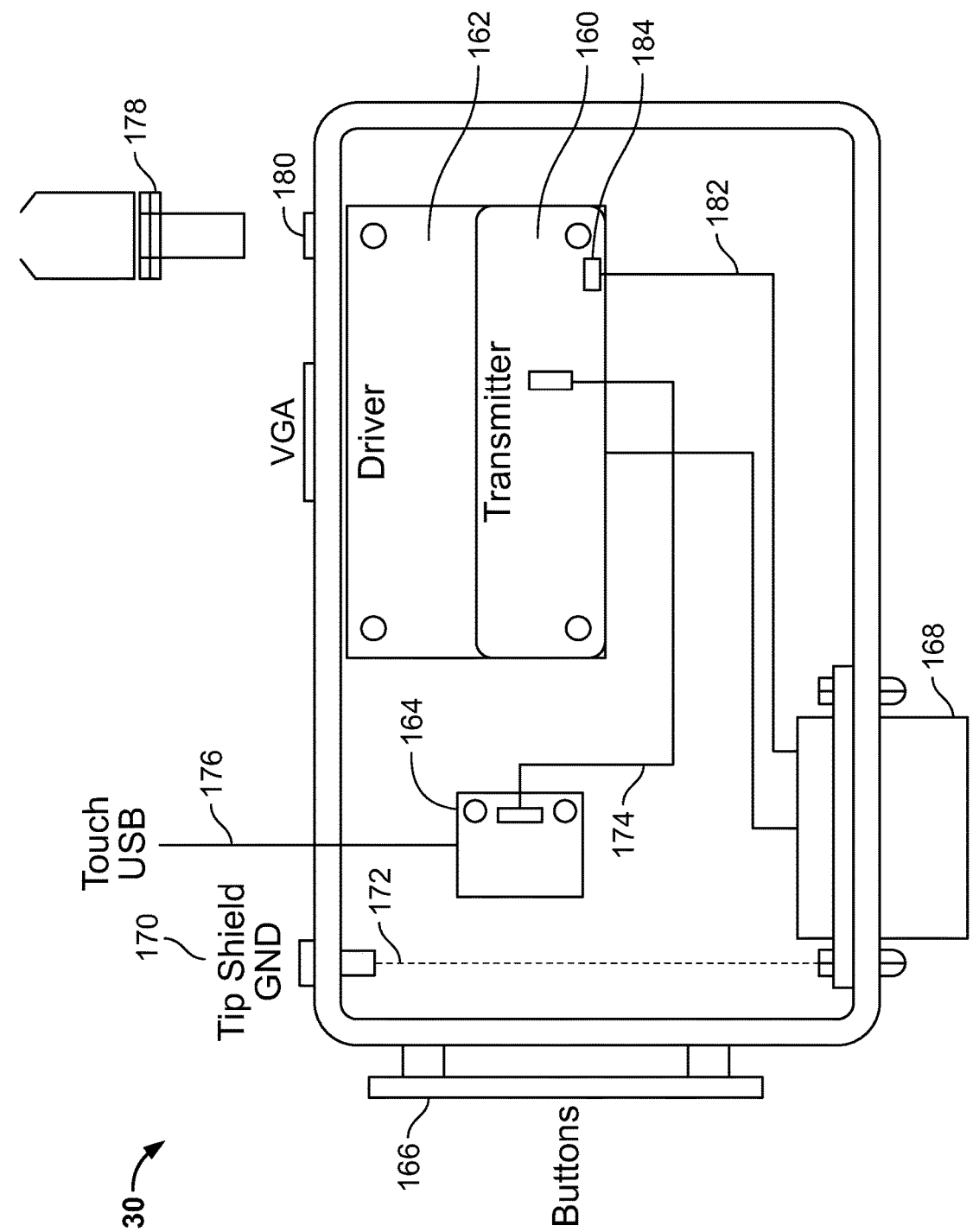
FIG. 21 is a top, plan view of an interface box of the tablet assembly of FIG. 2.

Referring now to FIG. 21, interface box 30 is depicted. As shown, box 30, which may be an ABS plastic box, generally includes a transmitter board 160, a driver board 162, a touchscreen driver board 164 (such as the STMPE610), a button board 166 and a female magnesium 24 pin connector 168. A tip jack 170 is also connected to box 30. A shielded ground wire 172 is soldered to tip jack 170. As interface box 30 is normally powered by an isolated wall power supply, to effectively shield box 30 and fMRI machine 12 from external signals, all grounding and RF shielding should be routed to building ground and is connected either through the AC outlet ground or the fMRI pass panel via tip jack 170. A female Molex four pin jumper cable 174 is connected to transmitter board 160 and touchscreen driver board 164 as further described herein. A mini US connector 176 is connected to touchscreen driver board 164. A 12 VDC power supply plug 178 is attached to a power jack 180 mounted to box 30 and connected to driver board 162. Finally, a female Molex five pin power connector 182 is connected between connector 168 and a power connector 184 mounted to transmitter board 160 as is further described herein.

Figure 22:
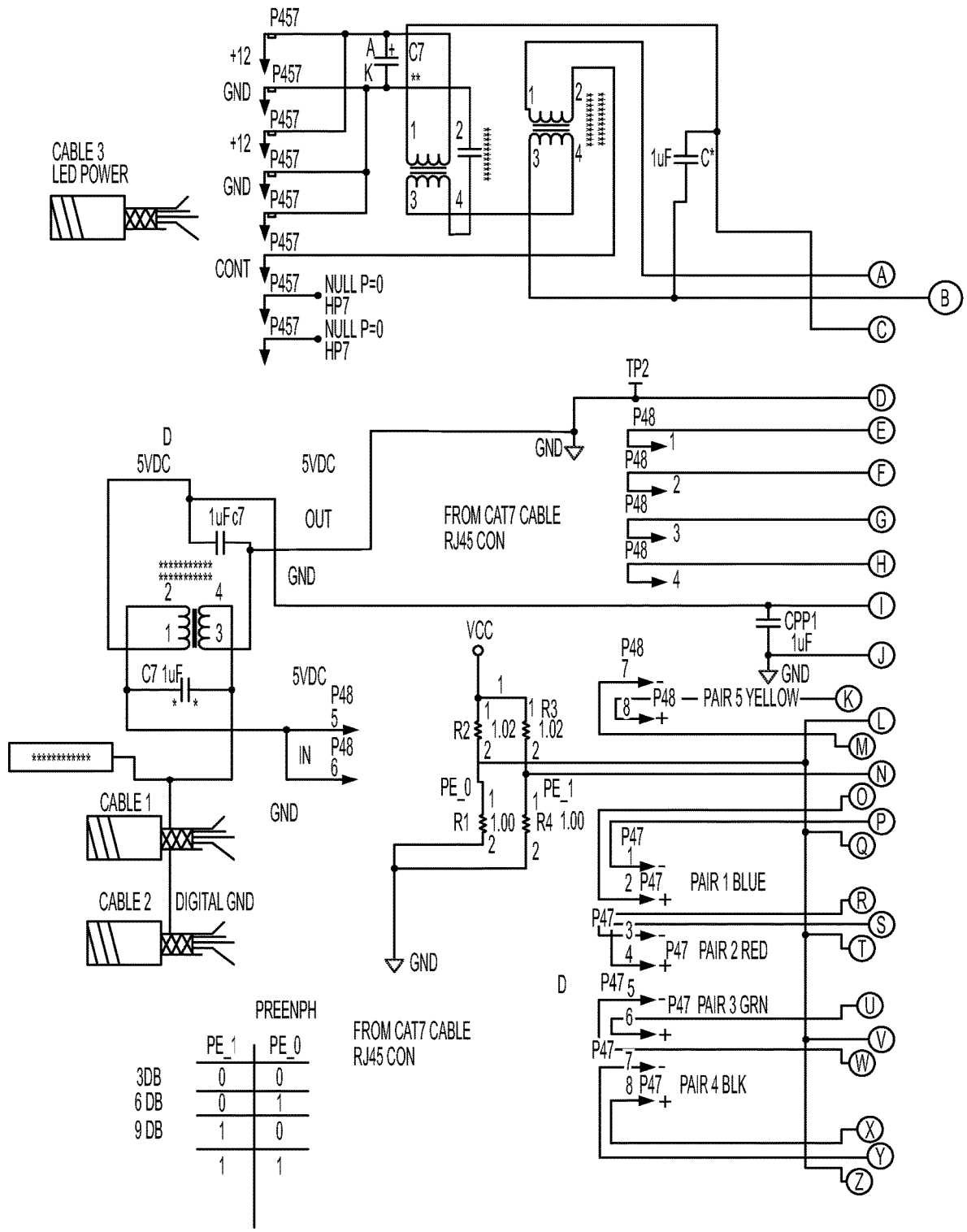
FIG. 22 is a schematic view of a receiver board of a tablet according to the present disclosure.
Figure 22:
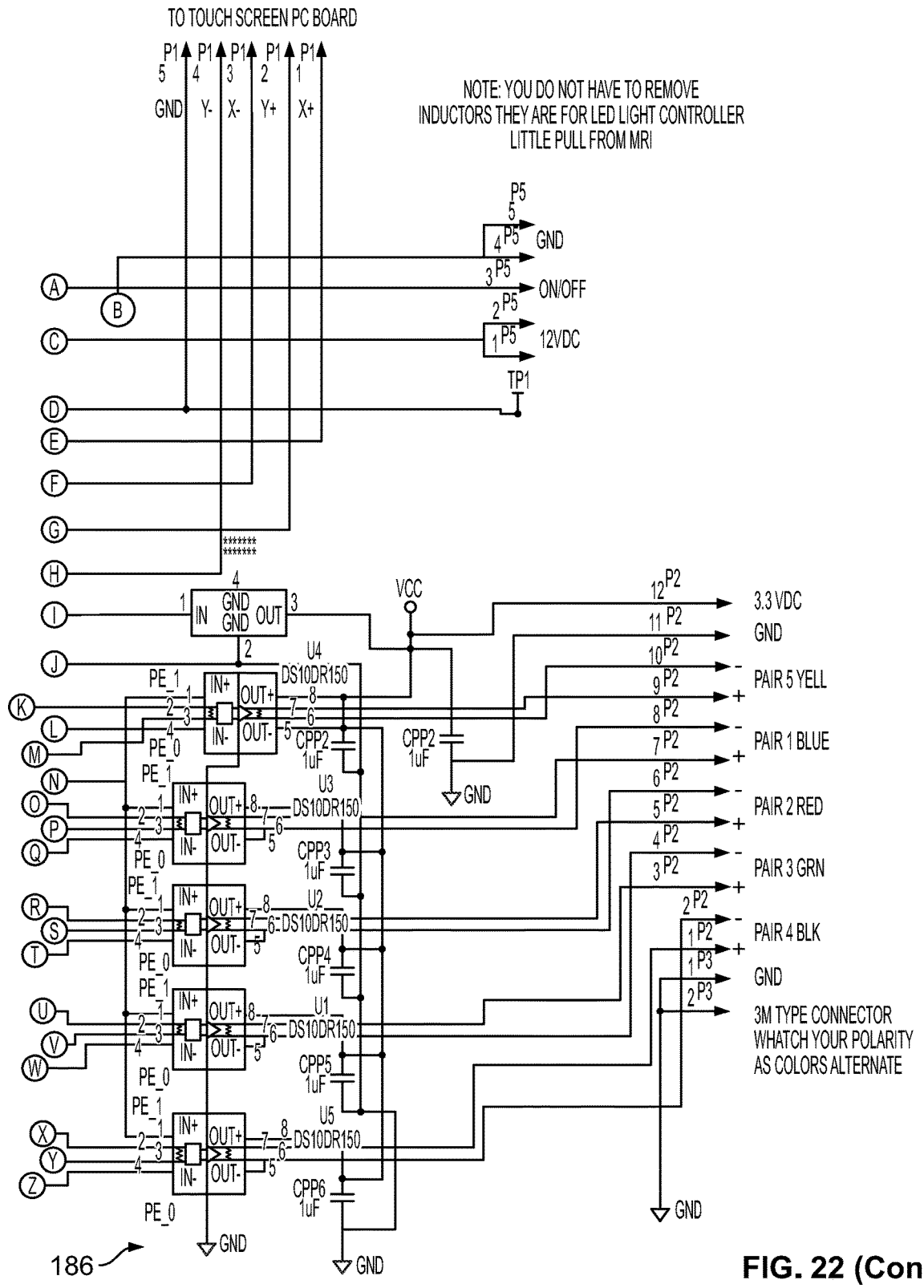
Figure 23:
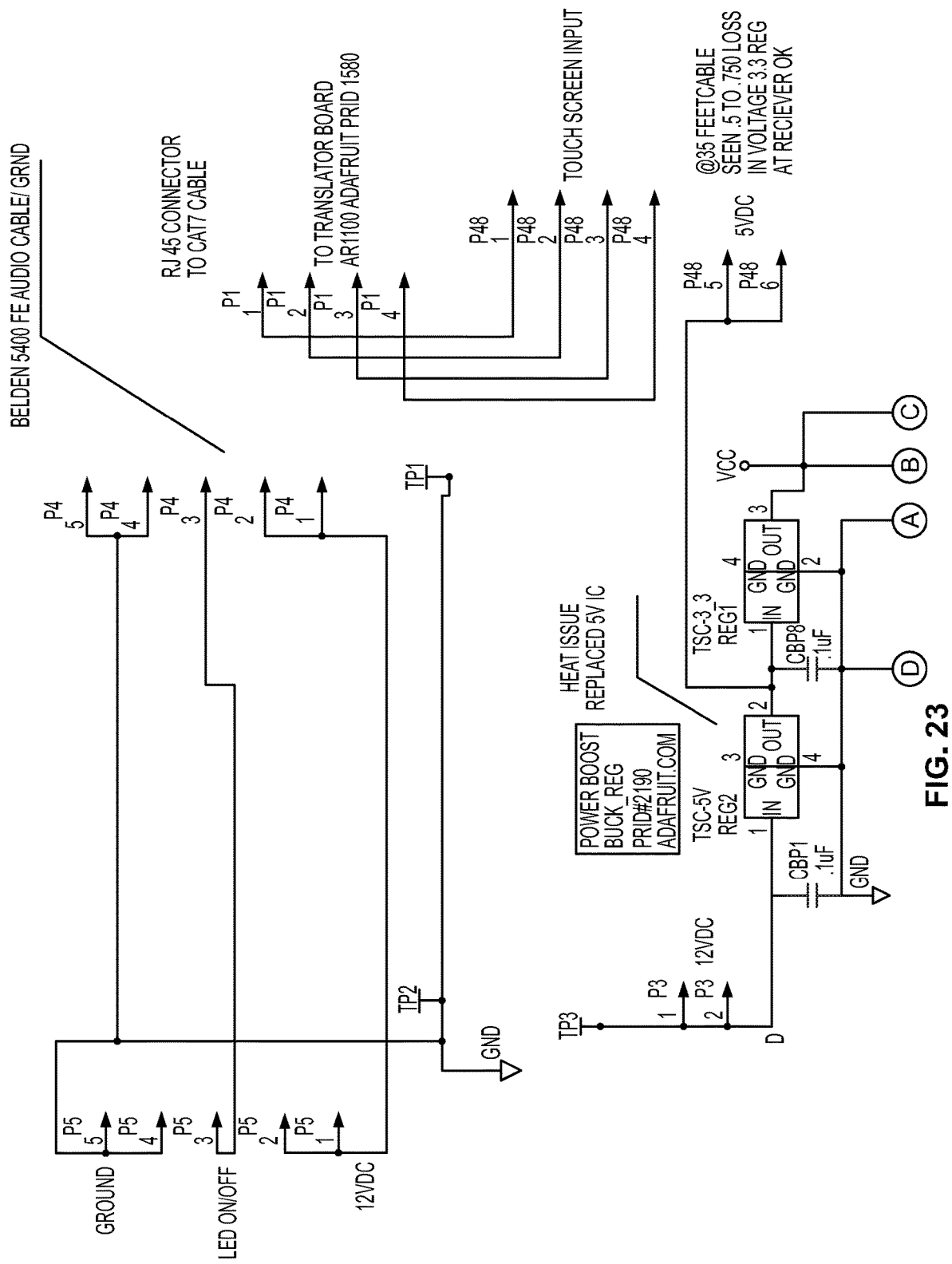
FIG. 23 is a schematic view of a driver board of the interface box of FIG. 21.
Figure 23:
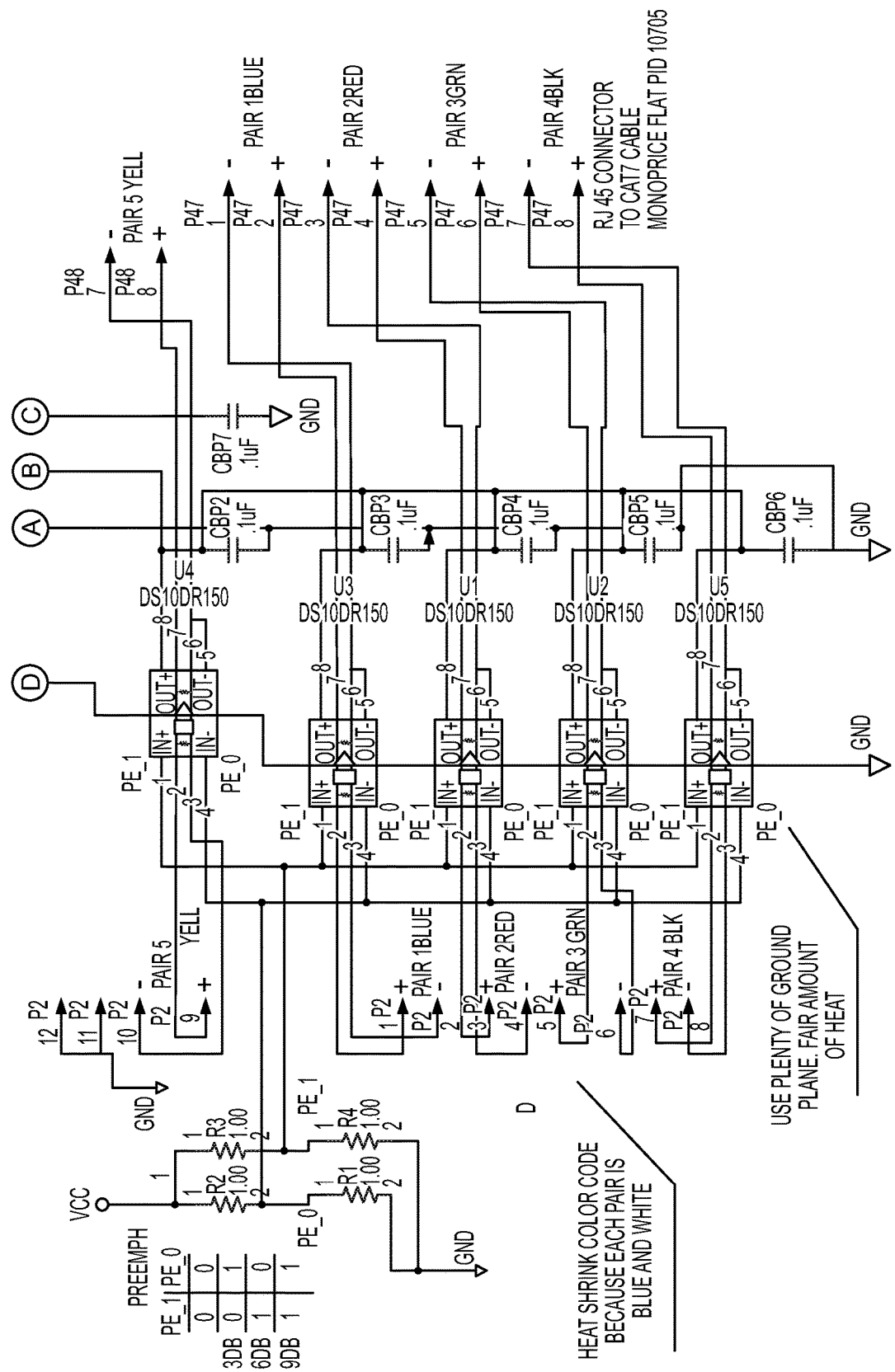
Figure 24:
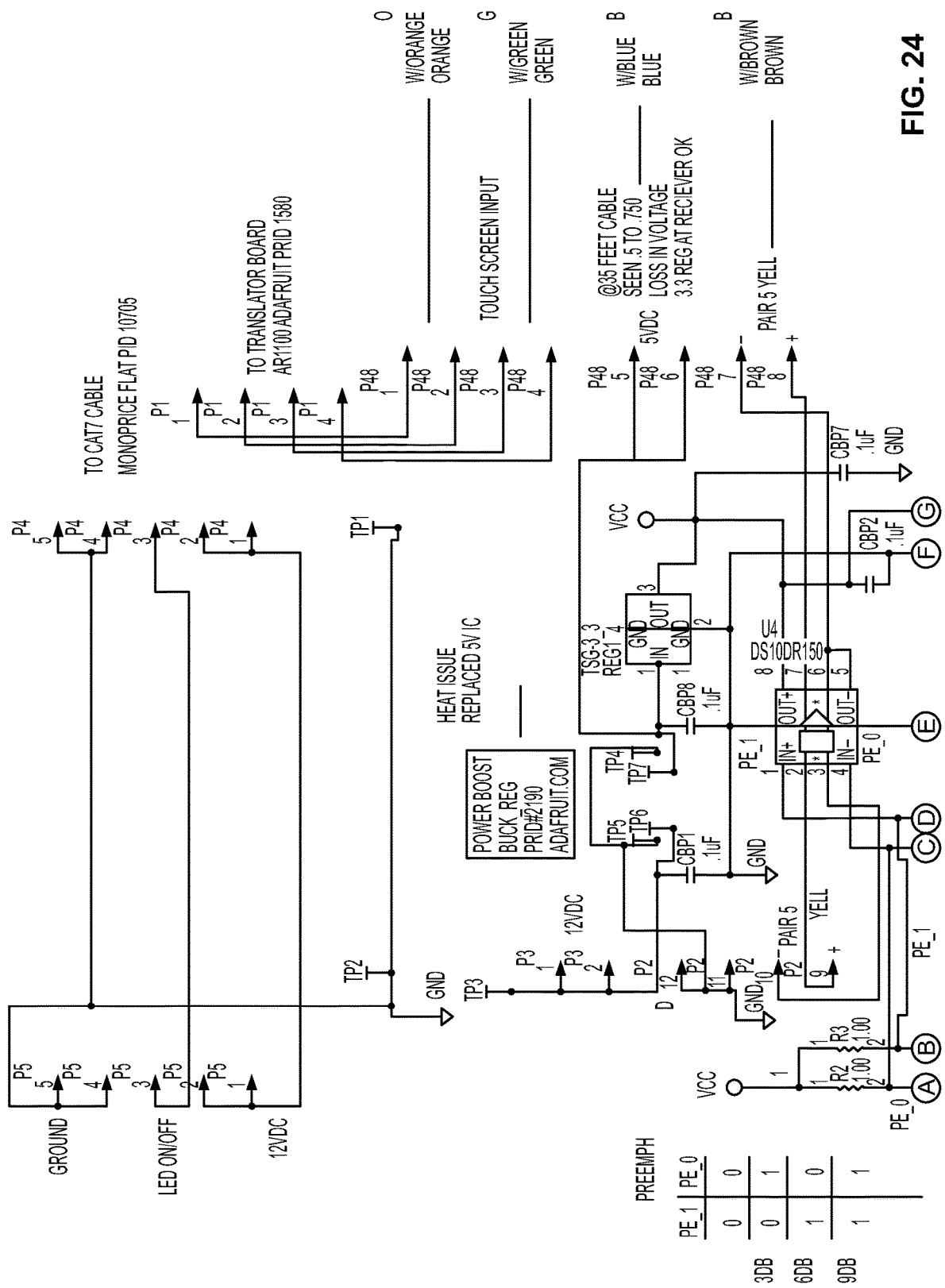
FIG. 24 is a schematic view of a transmitter board of the interface box of FIG. 21.
Figure 24:
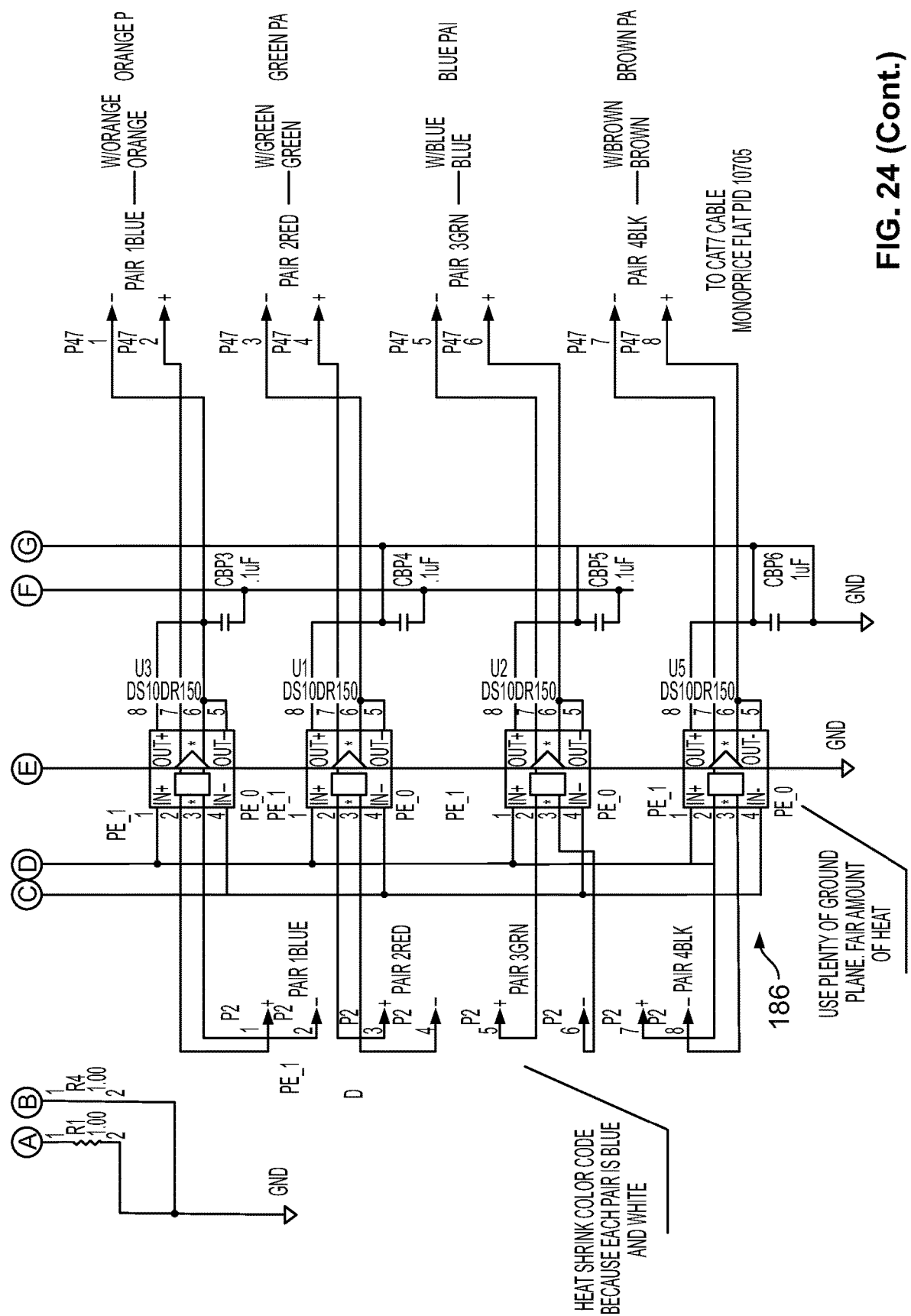
Figure 25:
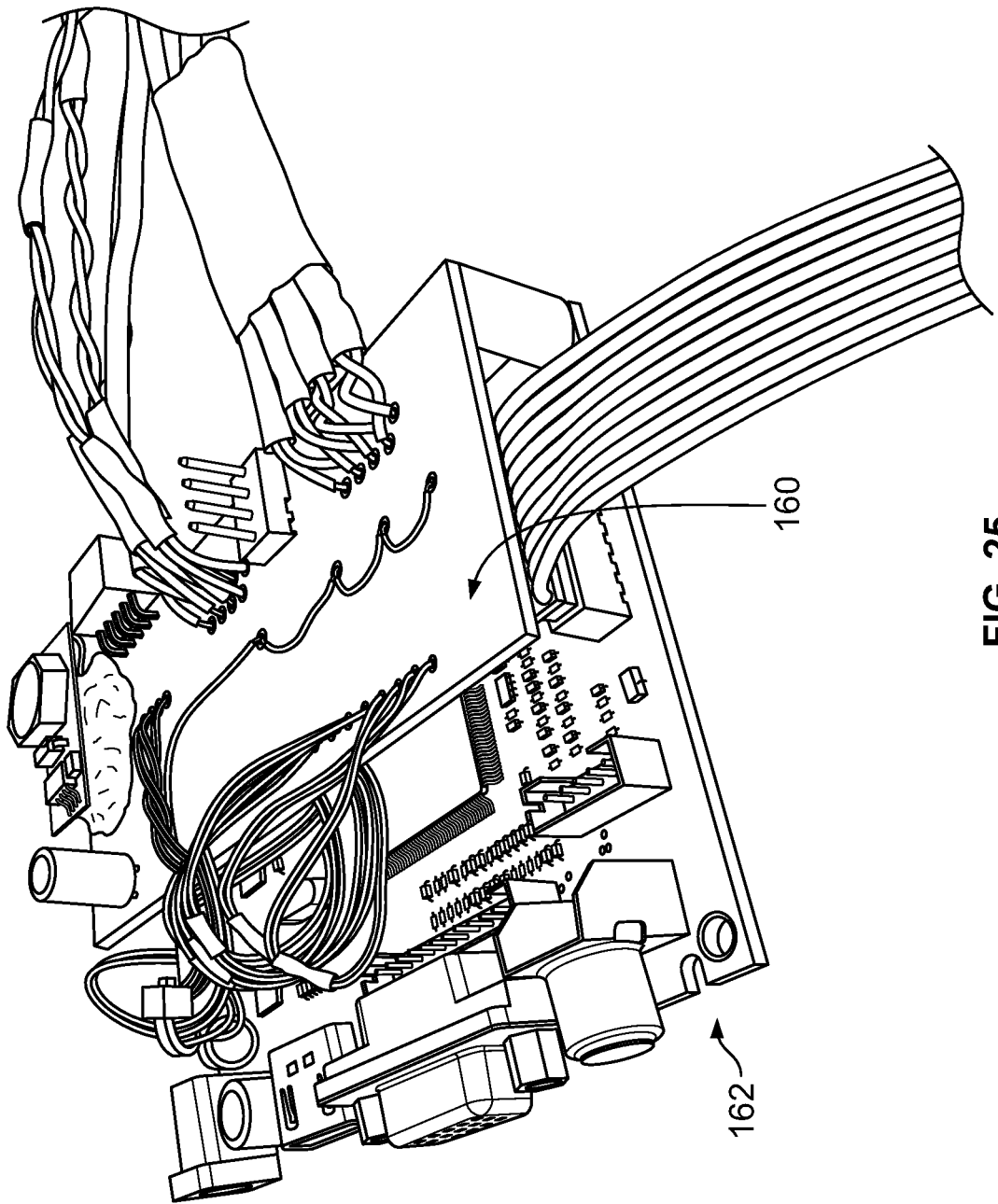
FIG. 25 is a perspective view of an assembly including the driver board of FIG. 23 and the transmitter board of FIG. 24.

FIG. 22 is a schematic diagram of receiver board 48 mounted within housing 34 of tablet 22. As shown, receiver board 48 uses a plurality of buffers 186 such as the DS10BR150 1.0 Gbps LVDS Buffer/Repeater available from Texas Instruments. FIG. 23 is a schematic diagram of driver board 162 (FIG. 21) of interface box 30. FIG. 24 is a schematic diagram of transmitter board 160 (FIG. 21) of interface box 30. As shown, transmitter board 160 also uses a plurality of buffers 186. Finally, FIG. 25 is a photograph depicting driver board 162 and transmitter board 160.

Various modifications and additions can be made to the exemplary embodiments discussed without departing from the scope of the present invention. While the embodiments described above refer to particular features, the scope of this invention also includes embodiments having different combinations of features and embodiments that do not include all of the described features. For example, tablet 22 may be modified in certain embodiments to include other common computer peripherals such as a mouse, keyboard, trackball, speakers, etc. Accordingly, the scope of the present invention is intended to embrace all such alternatives, modifications, and variations as fall within the scope of the claims, together with all equivalents thereof.

Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements. The scope is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B or C may be present in a single embodiment; for example, A and B, A and C, B and C, or A and B and C.

In the detailed description herein, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art with the benefit of the present disclosure to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. § 112(f), unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

We claim:

1. A support for a tablet for use in a Functional Magnetic Resonance Imaging (fMRI) machine, comprising:
   a plurality of curved braces configured to mount within a bore of the fMRI machine;
   a channel coupled to one end of the curved braces; and
   a pair of lower braces coupled to another end of the curved braces;
   wherein the channel includes a C-shaped opening configured to receive a mounting bracket coupled to the tablet.

2. The support of claim 1, wherein the channel is coupled to the one end of the curved braces by a pair of channel braces.

3. The support of claim 1, wherein the plurality of curved braces include a first curved brace including a first section and a second section, and a second curved brace including a first section and a second section.

4. The support of claim 3, wherein the first section of the first curved brace is coupled between the channel and a first lower brace, the second section of the first curved brace is coupled between the channel and a second lower brace, the first section of the second curved brace is coupled between the channel and the first lower brace, and the second section of the second curved brace is coupled between the channel and the second lower brace.

5. The support of claim 1, further comprises a tab connected to each lower brace and configured to couple the support to the fMRI machine.

6. The support of claim 1, wherein the C-shaped opening is sized to slidably receive the mounting bracket to permit adjustable positioning of the mounting bracket along a length of the channel.

7. The support of claim 1, wherein the mounting bracket includes an insert mounted to a top plate connected to braces.

8. The support of claim 7, further comprises a mounting plate attached to a housing of the tablet and connected to the top plate and the braces.

9. The support of claim 7, wherein the insert is sized to be received in the C-shaped opening of the channel.

10. The support of claim 7, wherein the tablet is positionable at any location along the length of the channel using a sliding interface between the insert and the C-shaped opening.

11. A support for a tablet for use in a Functional Magnetic Resonance Imaging (fMRI) machine, comprising:
   a first curved brace and a second curved brace, both being configured to fit within a bore of the fMRI machine;
   a pair of channel braces connecting the first curved brace and the second curved brace;
   a channel coupled to the first and second curved braces; and
   a pair of lower braces coupled to ends of the first and second curved braces;
   wherein the channel includes an opening configured to receive a mounting bracket coupled to the tablet.

12. The support of claim 11, wherein the channel includes an upper wall and a pair of side walls, which together form the opening.

13. The support of claim 12, wherein the opening is sized to slidably receive at least a portion of the mounting bracket.

14. The support of claim 11, wherein the support is integral to the fMRI machine for providing a support structure that conforms to an interior of the fMRI machine.

15. The support of claim 11, wherein the channel is connected between the pair of channel braces.

16. The support of claim 11, wherein the first curved brace is connected to one end of the pair of channel braces, and is connected to one end of the pair of lower braces.

17. The support of claim 16, wherein the second curved brace is connected to the other end of the pair of channel braces, and is connected to the other end of the pair of lower braces.

18. The support of claim 11, wherein the first curved brace includes a first section and a second section, and the second curved brace includes a third section and a fourth section.

19. The support of claim 18, wherein the first section and the third section extend substantially in parallel between one of the pair of lower braces and one of the pair of channel braces.

20. The support of claim 18, wherein the second section and the fourth section extend substantially in parallel between the other of the pair of lower braces and the other of the pair of channel braces.

* * * * *